United States Patent
Gunturu et al.

(10) Patent No.: US 11,876,531 B2
(45) Date of Patent: Jan. 16, 2024

(54) SMART DECODER

(71) Applicant: SAMSUNG ELECTRONICS CO., LTD., Suwon-si (KR)

(72) Inventors: Anusha Gunturu, Bangalore (IN); Ashok Kumar Reddy Chavva, Bangalore (IN); Avani Agrawal, Bangalore (IN); Saikrishna Pedamalli, Bangalore (IN); Satya Kumar Vankayala, Bangalore (IN); Anshuman Nigam, Bangalore (IN); Mohan Rao Naga Santha Goli, Bangalore (IN)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/748,650

(22) Filed: May 19, 2022

(65) Prior Publication Data

US 2022/0294471 A1   Sep. 15, 2022

Related U.S. Application Data

(63) Continuation of application No. PCT/KR2020/017124, filed on Nov. 27, 2020.

(30) Foreign Application Priority Data

Nov. 27, 2019 (IN) .............................. 201941048652
Dec. 18, 2019 (IN) .............................. 201941052666
Nov. 25, 2020 (IN) .............................. 2019 41048652

(51) Int. Cl.
*G06F 11/00* (2006.01)
*G06F 11/30* (2006.01)
(Continued)

(52) U.S. Cl.
CPC ............ *H03M 13/01* (2013.01); *G06N 3/048* (2023.01); *H03M 13/09* (2013.01)

(58) Field of Classification Search
CPC ....... H03M 13/01; H03M 13/09; G06N 3/048
See application file for complete search history.

(56) References Cited

U.S. PATENT DOCUMENTS

| 8,621,319 B2 | 12/2013 | Moon et al. |
| 2014/0211881 A1 | 7/2014 | Perry et al. |

(Continued)

FOREIGN PATENT DOCUMENTS

| CN | 104081669 | 8/2017 |
| CN | 107085693 | 8/2017 |
| KR | 10-2016-0119824 | 10/2016 |

OTHER PUBLICATIONS

International Search Report for PCT/KR2020/017124, dated Feb. 26, 2021, 3 pp.

(Continued)

*Primary Examiner* — Samir W Rizk
(74) *Attorney, Agent, or Firm* — NIXON & VANDERHYE P.C.

(57) ABSTRACT

Embodiments herein provide a method for predicting iterations for decoding an encoded data at an electronic device. The method includes: receiving, by the electronic device, the encoded data; detecting, by the electronic device, signal parameters associated with the encoded data; predicting, by the electronic device, one of a cyclic redundancy check (CRC) failure, CRC success, and a CRC uncertainty in iterations for decoding the encoded data based on the signal parameters using a Neural Network (NN) model.

20 Claims, 21 Drawing Sheets

(51) Int. Cl.
*G08C 25/00* (2006.01)
*H03M 13/00* (2006.01)
*H04L 1/00* (2006.01)
*H03M 13/01* (2006.01)
*H03M 13/09* (2006.01)
*G06N 3/048* (2023.01)

(56) References Cited

U.S. PATENT DOCUMENTS

| | | |
|---|---|---|
| 2014/0281843 A1 | 9/2014 | Lo et al. |
| 2015/0006992 A1 | 1/2015 | Xiong et al. |
| 2015/0230136 A1 | 8/2015 | Su et al. |
| 2019/0007068 A1* | 1/2019 | Arditti Ilitzky ... H03M 13/2993 |
| 2022/0114436 A1* | 4/2022 | Gopalan ............... H03M 13/09 |

OTHER PUBLICATIONS

Written Opinion for PCT/KR2020/017124, dated Feb. 26, 2021, 4 pp.

Hao Wu et al., "A Distributed CRC Early Termination Scheme for High Throughput QC-LDPC Codes", 10$^{th}$ International Conference on Wireless Communications and Signal Processing (WCSP), Hangzhou, 2018, 5 pp.

Jin Li et al., "Early Stopping for LDPC Decoding: Convergence of Mean Magnitude (CMM)", IEEE Communications Letters, vol. 10, No. 9, Sep. 2006, pp. 667-669.

Mohammed Almahamdy et al., "Half-Iteration Early Terminal of Turbo Decoding", IEEE 7th Annual Computing and Communication Workshop and Conference (CCWC), Las Vegas, NV, 2017, 5 pp.

Abdel Karim Al Tamimi, "Exponential Effective Signal to Noise Ratio Mapping (EESM) Computation for Wimax Physical Layer", Washington University, May 2007, 70 pp.

Hongmin Zheng et al., IEEE C802.16m-07/187, "Link Performance Abstraction for ML Receivers based on RBIR Metrics", IEEE 802.16 TGm contribution, Sep. 10, 2007, 18 pp.

Examination Report dated Jan. 4, 2022 in counterpart Indian Patent Application No. 201941048652.

* cited by examiner

FIG. 7H

| Activation function | Equation | Example | 1D Graph |
|---|---|---|---|
| Unit step (Heaviside) | $\phi(z) = \begin{cases} 0, & z < 0, \\ 0.5, & z = 0, \\ 1, & z > 0, \end{cases}$ | Perceptron variant | |
| Sign (Signum) | $\phi(z) = \begin{cases} -1, & z < 0, \\ 0, & z = 0, \\ 1, & z > 0, \end{cases}$ | Perceptron variant | |
| Linear | $\phi(z) = z$ | Adaline, linear regression | |
| Piece-wise linear | $\phi(z) = \begin{cases} -1, & z \geq \frac{1}{2}, \\ z + \frac{1}{2}, & -\frac{1}{2} < z < \frac{1}{2}, \\ 0, & z \leq -\frac{1}{2}, \end{cases}$ | Support vector machine | |
| Logistic (sigmoid) | $\phi(z) = \dfrac{1}{1 + e^{-z}}$ | Logistic regression, Multi-layer NN | |
| Hyperbolic tangent | $\phi(z) = \dfrac{e^{z} - e^{-z}}{e^{z} + e^{-z}}$ | Multi-layer Neural Networks | |
| Rectifier, ReLU (Rectified Linear Unit) | $\phi(z) = \max(0, z)$ | Multi-layer Neural Networks | |
| Rectifier, softplus | $\phi(z) = \ln(1 + e^{z})$ | Multi-layer Neural Networks | |

Linear   $g(z) = z$
Logistic (sigmoid)   $g(z) = 1/(1+\exp(-z))$
Hyperbolic tangent (sigmoid)   $g(z) = \dfrac{\exp(2z) - 1}{\exp(2z) + 1}$
...

A selection of commonly used activation functions for artificial neurons.

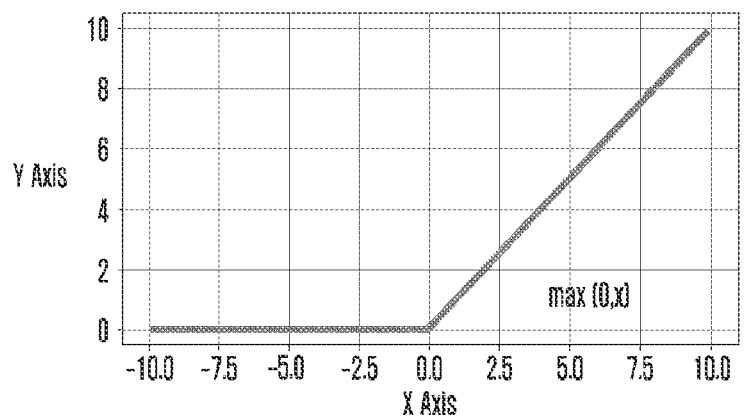

ReLU Activation Function

SMART DECODER

CROSS-REFERENCE TO RELATED APPLICATIONS

This application is a continuation of International Application No. PCT/KR2020/017124 designating the United States, filed on Nov. 27, 2020, in the Korean Intellectual Property Receiving Office and claiming priority to Indian Provisional Patent Application No. 201941048652, filed on Nov. 27, 2019, in the Indian Patent Office, to Indian Provisional Patent Application No. 201941052666, filed on Dec. 18, 2019, in the Indian Patent Office, and to Indian Non-Provisional Patent Application No. 201941048652, filed on Nov. 25, 2020, in the Indian Patent Office, the disclosures of all of which are incorporated by reference herein in their entireties.

BACKGROUND

Field

The disclosure relates to communication systems, and for example to a method and an electronic device for predicting iterations for decoding an encoded data.

Description of Related Art

Channel coding is a forward error control coding procedure followed in digital communication systems to detect and correct errors in information bits. The errors occur due to fading, interference and noise in a communication channel. The channel coding is referred to as encoding at a transmitter, where redundant bits are added to the information bits during the encoding. The channel coding is referred to as decoding at a receiver. FIGS. 1A-1B are block diagrams illustrating an overview of an encoding technique and a decoding technique in the digital communication systems, according to a prior art. As shown in FIG. 1A, a channel encoder (11) performs the encoding of the information bits at the transmitter. An output of the channel encoder (12) is called a codeword. The channel encoder (11) is defined by a coderate, e.g., K/N, where the redundant bits are added to the information bits of 'K' length to obtain the codeword of 'N' length. As shown FIG. 1B, a channel decoder (14) performs the decoding of Log Likelihood Ratios (LLRs) of the codeword (13) at the receiver. The output of the channel decoder (10) is the information bits which is encoded at the transmitter.

FIGS. 2A-2B are block diagrams illustrating a method for an error detection in the encoding using a Cyclic Redundancy Check (CRC), according to a prior art. The CRC is used as a code for the error detection in the encoding of the information bits. As shown in FIG. 2A, a CRC generator (15) of the transmitter adds parity bits as the code to the information bits of length 'K' for generating a CRC added information bits (16) of length K+n. The CRC generator (15) uses a cyclic polynomial generator to generate the parity bits, where the cyclic polynomial generator is known to both the transmitter and the receiver. The cyclic generator polynomial divides the information bits and produces a remainder of 'n' bits to be used as the parity bits. The channel encoder (11) generates the codeword with the length 'N' (12) using the CRC added information bits. As shown in FIG. 2B, the channel decoder (14) performs the decoding of the LLRs of the codeword (13) at the receiver. The output of the channel decoder (14) is the CRC added information bits (16) which is encoded at the transmitter. Further, a CRC controller (17) of the receiver performs a CRC check to know whether the decoded codeword is same as the transmitted codeword. In order to perform the CRC, the CRC controller (17) generates CRC bits using the CRC added information bits (16) obtained from the decoder (14) and checks (18) if the remainder is zero. The decoding of the CRC added information bits (16) is a success if the remainder is zero. The decoding of the CRC added information bits (16) is a failure if the remainder is non-zero.

The decoder (14) of the User Equipment (UE) typically operates with a fixed number of iterations to know whether the decoding of the CRC added information bits (16) is the failure or the success. Due to a computational complexity for processing each iteration within the decoder (14), a power consumption at the UE is significantly high for the decoding. In case the UE knows the failure or success of decoding of the CRC added information bits (16) early, the UE can take decision on whether to continue or terminate the iterations. Early termination of the iteration in the decoding cause to reduce the power consumption at the UE. Hence, it is desired to provide a method for early termination of the iterations of the decoder (14) with a successful prediction on the failure or success of the decoding.

SUMMARY

Embodiments of the disclosure provide a method and an electronic device for predicting iterations for decoding an encoded data. The electronic device can predict a CRC success or a CRC failure or a CRC uncertainty in the iterations early based on signal parameters. Upon detecting the CRC failure, the electronic device can terminate further iterations in the decoding. Due to terminating further iterations in the decoding, the electronic device can significantly save a power required for running further iterations in the decoding.

Embodiments of the disclosure improve a throughput of the electronic device and reduce a latency in the decoding by reducing a time consumed for decoding the encoded data.

Embodiments of the disclosure may provide early identification the CRC success before completing the iterations in the decoding. Upon detecting the CRC success, the electronic device can terminate further iterations in the decoding. Due to terminating further iterations in the decoding, the electronic device can significantly save the power required for running further iterations in the decoding.

Embodiments of the disclosure indicate the number of iterations required to run the decoder for the CRC success or indicate the CRC failure based on the signal parameters.

Embodiments of the disclosure scale up internal metrics of the decoder in each iteration for early decoding of the encoded data.

Accordingly, the various example embodiments herein provide a method for predicting iterations for decoding an encoded data at an electronic device. The method includes: receiving, by the electronic device, the encoded data; detecting, by the electronic device, signal parameters associated with the encoded data for decoding the encoded data; predicting, by the electronic device, one of a cyclic redundancy check (CRC) failure, CRC success, and a CRC uncertainty in the iterations based on the signal parameters using a Neural Network (NN) model.

In an example embodiment, the method includes: performing, by the electronic device, one of: terminating decoding of the encoded data in response to predicting the CRC failure in the iterations, determining a number of iterations required for obtaining the CRC success in the iterations based on the signal parameters using the NN model in response to predicting the CRC success in the iterations, and a next iteration in decoding of the encoded data in response predicting the CRC uncertainty in the iterations.

In an example embodiment, the method includes: converting, by the electronic device, the encoded data into a CRC added information data based on the number of iterations using a decoder, determining, by the electronic device, whether a CRC check on the CRC added information data is successful, and performing, by the electronic device, one of: terminating decoding of the encoded data, and obtaining information data from the CRC added information data, in response to determining that the CRC check on the CRC added information data is successful, and performing a next iteration in decoding of the encoded data, in response to determining that the CRC check on the CRC added information data is unsuccessful.

In an example embodiment, scaling up internal metrics of the decoder in each iteration leads to a successful early decoding of the encoded data.

In an example embodiment, the NN model is trained for the prediction by determining, by the electronic device, a maximum number of iterations in decoding of the encoded data, estimating, by the electronic device, a first CRC status in a half of the maximum number of iterations based on the signal parameters, where the first CRC status is one of the CRC success and the CRC failure, determining, by the electronic device, a second CRC status in the maximum number of iterations based on the signal parameters, where the second CRC status is one of the CRC success and the CRC failure, and training, by the electronic device, the NN model for the prediction based a match between the first CRC status and the second CRC status.

In an example embodiment, the signal parameters include: a Modulation and Coding Scheme (MCS), a Signal-to-Noise Ratio (SNR), an Instantaneous Channel Statistics (h), an Averaged Mutual Information (MI), an intermediate Log Likelihood Ratio (LLR) statistics of a decoder, apriori LLRs of the encoded data or a normalized histogram of the LLRs, a demodulated message, turbo code parameters (e.g. number of interleavers, an availability of tail biting, a length of a message, a length of parity bits, a memory map of a turbo code), and a Channel quality indicator (CQI).

In an example embodiment, the NN model includes: an input layer, an output layer with a classifier for three classes of CRC prediction, and three hidden layers with leaky rectified linear unit (ReLU) activation functions and a plurality of neural blocks in each layer.

In an example embodiment, where the encoded data is one among the codes corresponding to iterative decoding such as Low-Density Parity Check (LDPC) code and a turbo code.

In an example embodiment, the prediction is the CRC uncertainty when the electronic device is unsure on predicting the CRC failure and the CRC success.

Accordingly, the various example embodiments herein provide the electronic device for predicting iterations for decoding the encoded data. The electronic device includes: an iteration controller, a decoder, a memory, a processor, where the iteration controller is coupled to the memory and the processor. The iteration controller is configured to: receive the encoded data; detect signal parameters associated with the encoded data for decoding the encoded data; predict one of the cyclic redundancy check (CRC) failure, the CRC success and the CRC uncertainty in the iterations based on the signal parameters using a neural network (NN) model.

These and other aspects of the various example embodiments herein will be better appreciated and understood when considered in conjunction with the following description and the accompanying drawings. It should be understood, however, that the following descriptions, while indicating various example embodiments and numerous specific details thereof, are given by way of illustration and not of limitation. Many changes and modifications may be made within the scope of the embodiments herein without departing from the spirit thereof, and the embodiments herein include all such modifications.

The various example embodiments of present disclosure may provide a method and an electronic device for predicting iterations for decoding an encoded data. The electronic device can predict a CRC success or a CRC failure or a CRC uncertainty in the iterations early based on signal parameters. Upon detecting the CRC failure, the electronic device can terminate further iterations in the decoding. Due to terminating further iterations in the decoding, the electronic device can significantly save a power required for running further iterations in the decoding.

BRIEF DESCRIPTION OF THE DRAWINGS

This method and electronic device are illustrated in the accompanying drawings, throughout which like reference letters indicate corresponding parts in the various figures. The above and other aspects, features and advantages of certain embodiments of the present disclosure will be more apparent from the following detailed description, taken in conjunction with the accompanying drawings, in which:

FIG. 7H is a diagram illustrating example activation functions used in the neural network, according to various embodiments;

DETAILED DESCRIPTION

Figure 1A:
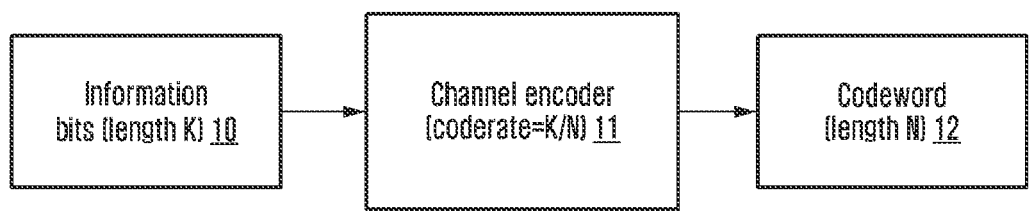
FIGS. 1A and 1B are block diagrams illustrating an overview of an encoding technique and a decoding technique in digital communication systems, according to a prior art.
Figure 1B:
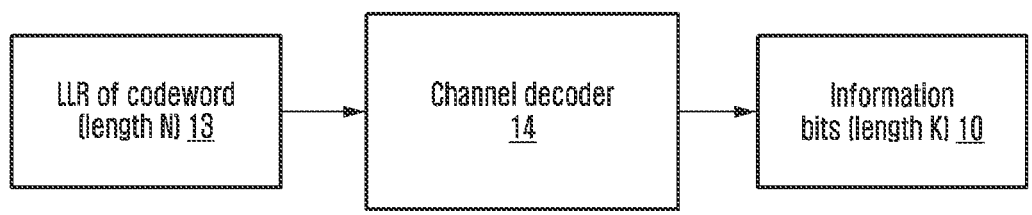
Figure 2A:
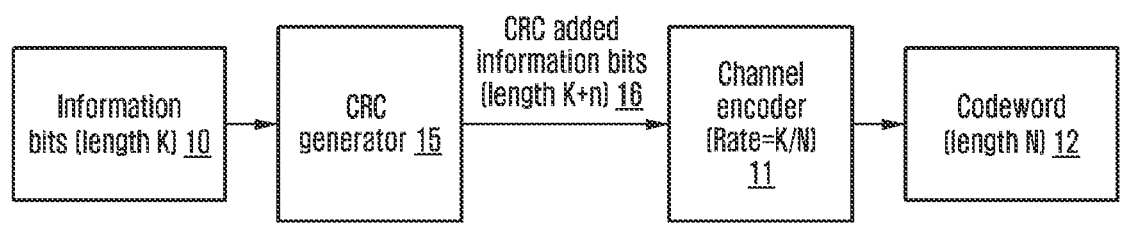
FIGS. 2A and 2B are block diagrams illustrating a method for an error detection in encoding using a CRC, according to a prior art.
Figure 2B:
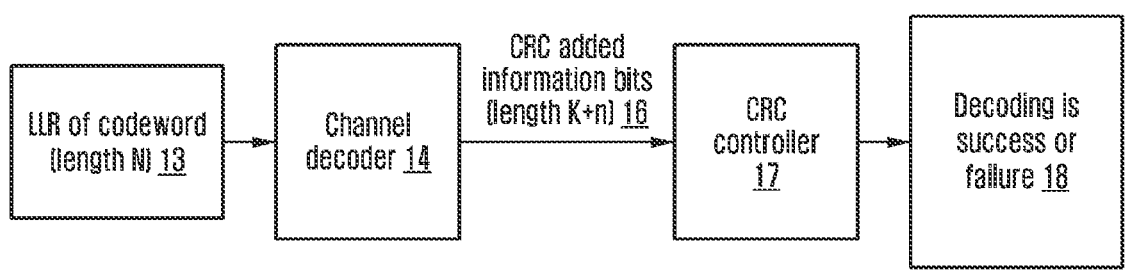

The various example embodiments herein and the various features and advantageous details thereof are explained more fully with reference to the non-limiting embodiments that are illustrated in the accompanying drawings and detailed in the following description. Descriptions of well-known components and processing techniques may be omitted so as to not unnecessarily obscure the embodiments herein. The various example embodiments described herein are not necessarily mutually exclusive, as various embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the disclosure.

Various example embodiments may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware (e.g., including various executable program instructions). The circuits may, for example, be embodied in one or more semiconductor chips, or on substrate supports such as printed circuit boards and the like. The circuits of a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

Accordingly, the embodiments herein provide an example method for predicting iterations for decoding an encoded data at an electronic device. The method includes: receiving, by the electronic device, the encoded data; detecting, by the electronic device, signal parameters associated with the encoded data for decoding the encoded data; and predicting, by the electronic device, one of a CRC failure, CRC success, and a CRC uncertainty in the iterations based on the signal parameters using a NN model.

Accordingly, the example embodiments herein provide the electronic device for predicting the iterations for decoding the encoded data. The example electronic device includes: an iteration controller, a decoder, a memory, a processor, where the iteration controller is coupled to the memory and the processor. The iteration controller is configured to: receive the encoded data; detect the signal parameters associated with the encoded data for decoding the encoded data; and predict one of the CRC failure, the CRC success and the CRC uncertainty in the iterations based on the signal parameters using the NN model, wherein the NN model is one of an Artificial Intelligence (AI) model, a Machine Learning (ML) model and a hybrid model. The terms 'NN', 'ML', 'AI' are used interchangeably.

Unlike existing methods and systems, the electronic device predicts the CRC success or the CRC failure early. Upon detecting the CRC failure, the electronic device can terminate remaining iterations in the decoding. Due to terminating further iterations in the decoding, the electronic device can significantly save power required for running further iterations in the decoding.

Unlike existing methods and systems, the electronic device identifies the CRC success before completing the iterations in the decoding. Upon detecting the CRC success, the electronic device can terminate further iterations in the decoding. Due to terminating further iterations in the decoding, the electronic device can significantly save the power required for running further iterations in the decoding.

Unlike existing methods and systems, the electronic device can quickly generate the information bits due to the early termination of iterations in decoding of the encoded data. In response to quickly generating the information bits, the disclosed method improves a throughput of the electronic device. Moreover, the disclosed method reduces a latency in the decoding in response to quickly generating the information bits.

Referring now to the drawings, and more particularly to FIGS. 3A through 11, there are shown various example embodiments.

Figure 3A:
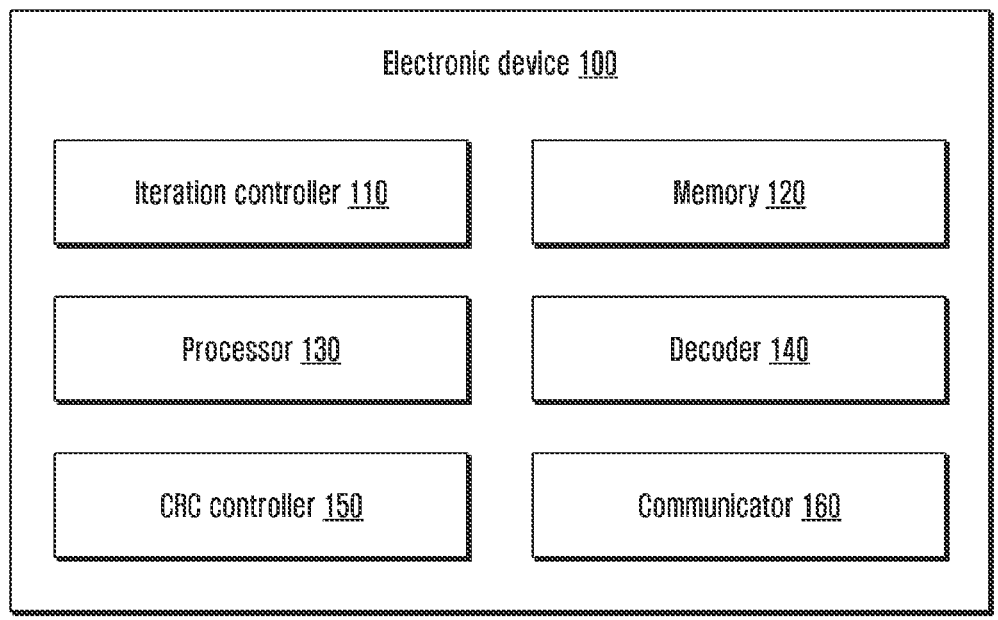
FIG. 3A is a block diagram illustrating an example configuration of an electronic device for early termination of iterations in decoding an encoded data, according to various embodiments.

FIG. 3A is a block diagram illustrating an example configuration of an electronic device (100) for early termination of iterations in decoding an encoded data, according to various embodiments. In an embodiment, the encoded data is data corresponding to information bits added with redundant bits using one of encoders that have iterative decoders at a receiver such as a Low-Density Parity Check (LDPC) code or a turbo code. The turbo code is used in 3G/4G mobile networks for data communication. The LDPC code is a linear error correcting code used in 5G mobile networks for the data communication. Examples of the electronic device (100) include but is not limited to a user equipment, a base station, a Virtualized Radio Access Network (VRAN), a Centralized Radio Access Network (CRAN), an Open Radio Access Network (O-RAN), a network service function, a virtualized network function, a smart phone, a tablet computer, a Personal Digital Assistance (PDA), a desktop computer, a cloud server, and an Internet of Things (IoT). In an embodiment, the electronic device (100) includes an iteration controller (e.g., including various processing circuitry) (110), a memory (120), a processor (e.g., including processing circuitry) (130), a decoder (140), a CRC controller (150) and a communicator (e.g., including communication circuitry) (160). The iteration controller (110) may be implemented by processing circuitry such as logic gates, integrated circuits, microprocessors, microcontrollers, memory circuits, passive electronic components, active electronic components, optical components, hardwired circuits, or the like, and may optionally be driven by. The circuits may, for example, be embodied in one or more semiconductor chips, or on substrate supports such as printed circuit boards and the like.

The iteration controller (110) is configured to receive the encoded data. Further, the iteration controller (110) is configured to detect signal parameters associated with the encoded data for decoding the encoded data. In an embodiment, the signal parameters include a Modulation and Coding Scheme (MCS), a Signal-to-Noise Ratio (SNR), an Instantaneous Channel Statistics (h) obtained using the channel coefficients estimated using pilots or reference signals in a transmission, an Averaged Mutual Information (MI) between transmitted and received pilot symbols, an intermediate Log Likelihood Ratio (LLR) statistics of the decoder (140), apriori LLRs of the encoded data or a normalized histogram of the LLRs, a long term Infinite Impulse Response (IIR)/Finite Impulse Response (FIR) filtered statistics, a short term IIR/FIR filtered statistics, a distribution of the long term IIR/FIR filtered statistics, a distribution of the short term IIR/FIR filtered statistics, a Signal-to-Interference-Noise Ratio (SINR), an expected SINR, Channel State Information (CSI), a Multiple-Input and Multiple-Output (MIMO) transmission mode, a MIMO rank, an operating frequency, a capability of the electronic device (100), an earlier prediction info long/short/filtered statistics, resource blocks, QoS Class Identifier (QCI), a transmission mode, a Channel quality indicator (CQI) of a wideband, a sub-band CQI, a M-sub-band CQI, a Rank Indicator (RI), a Precoding Matrix Indicator (PMI).

A statistics include probability distribution, mean, variance, other probability moment generating functions. These probability distribution can be based on the short term or long term or IIR/FIR filtered data of variable parameters mentioned in this disclosure. The statistics include joint density functions of sub-set of the parameters or all the parameters. The joint density functions can be built based on the short or long or IIR or FIR filtered data of variable parameters. The iteration controller (110) is configured to use long term statistics of some parameter(s) and short term statistics of some other parameter(s) or/and IIR filtered parameter(s) of some other parameter(s) or FIR filtered parameter(s) of rest of the parameter(s).

The LLR is the logarithm of a ratio of probability of a transmitted symbol being "1" given a received symbol to the probability of the transmitted symbol being "0" given the received symbol. The MCS is obtained by reading Downlink Control Indicator (DCI). The SNR is obtained after a channel estimation, where the SNR is determined using instantaneous SNR of all reference signals at the electronic device (100). The SNR can be either an average of the instantaneous SNR or a SNR obtained using an Exponential Effective SNR Mapping (EESM) method or an effective SNR obtained using Received Bit Information Metric (RBIR). The apriori LLRs are the received LLRs corresponding to each bit of a codeword. The normalized histogram of the LLRs is independent of a length of the codeword. The channel statistics are taken as absolute values of channel estimation coefficients on the reference signals or pilot signals. The channel statistics is fed to the NN model (114) as a vector of $|h_i|^2$ for all i={1, 2, . . . , P}, where P is a number of pilot symbols. The MI is obtained using the instantaneous SNR obtained on the pilot symbols. The MI can be fed to the NN model (114) in 2 types. Type 1: Feed a vector of MI on all the pilot symbols e.g., $MI_i$ for all i={1, 2, . . . , P}. Type 2: Feed an average of the MI on all the pilot symbols e.g., $$\frac{\sum MI_i}{P}.$$

The iteration controller (110) is configured to predict one of a Cyclic Redundancy Check (CRC) failure, a CRC success, and a CRC uncertainty in the iterations based on the signal parameters using a Machine Learning (ML) model (114). In an embodiment, the prediction is the CRC uncertainty when the electronic device (100) is unsure on predicting the CRC failure and the CRC success. The NN model (114) is a fully connected Deep Neural Network (DNN) that includes an input layer (701) with the input parameters, an output layer (705) with a classifier (706) for three classes of CRC prediction, and three hidden layers (702, 703, 704) with leaky ReLU activation functions (707) and a plurality of neural blocks in each layer. A softmax classifier is an example for the classifier (706).

In an embodiment, the iteration controller (110) is configured to train the NN model (114) for the prediction. The iteration controller (110) is configured to determine a maximum number of iterations ($I_{MAX}$) in decoding of the encoded data. The iteration controller (110) is configured to use a first CRC status in a half of the maximum number of iterations $$\left(\left\lceil\frac{I_{MAX}}{2}\right\rceil\right)$$

based on the signal parameters, where the first CRC status is the CRC success or the CRC failure. The iteration controller (110) is configured to use a second CRC status in the maximum number of iterations based on the signal parameters, where the second CRC status is the CRC success or the CRC failure. The iteration controller (110) is configured to train the NN model (114) for the prediction based a match between the first CRC status and the second CRC status. When the first CRC status and the second CRC status are the CRC success, the iteration controller (110) is configured to predict a first class of the CRC prediction (p0). When the first CRC status and the second CRC status are the CRC failure, the iteration controller (110) is configured to predict a second class of the CRC prediction (p1). When the first CRC status is the CRC failure and the second CRC status is the CRC success, the iteration controller (110) is configured to predict a third class of the CRC prediction (p2).

The iteration controller (110) is configured to terminate decoding of the encoded data, in response to predicting the CRC failure in the iterations. The iteration controller (110) is configured to perform a next iteration in decoding of the encoded data, in response predicting the CRC uncertainty in the iterations.

The iteration controller (110) is configured to determine a number of iterations required for obtaining the CRC success in the iterations based on the signal parameters using the NN model (114), in response to predicting the CRC success in the iterations. Further, the iteration controller (110) is configured to convert the encoded data into a CRC added information data (e.g., CRC added information bits) based on the number of iterations using the decoder (140). In an embodiment, the iteration controller (110) is configured to determine a time required for the CRC success by the number of iterations. Further, the iteration controller (110) is configured to terminate decoding of the encoded data, in response to detecting that the time required for the CRC success by the number of iterations is greater than a threshold time. The iteration controller (110) is configured to decode the encoded data by the number of iterations, in response to detecting that the time required for the CRC success by the number of iterations is lesser than the threshold time. In an embodiment, the iteration controller (110) is configured to determine the threshold time based on the signal parameters, encoding and decoding capabilities, a latency requirement, network conditions, a temperature, a network load, etc.

Further, the iteration controller (110) is configured to determine whether a CRC check on the CRC added information data is successful. The iteration controller (110) is configured to terminate decoding of the encoded data in response to determining that the CRC check on the CRC added information data is successful. Further, the iteration controller (110) is configured to obtain information data (e.g., information bits) from the CRC added information data. The iteration controller (110) is configured to perform next iteration in decoding of the encoded data, in response to determining that the CRC check on the CRC added information data is unsuccessful. In an embodiment, the iteration controller (110) is configured to scale up internal metrics corresponding to each bit within the decoder (140) in each iteration for a successful early decoding of the encoded data. Examples of the internal metrics are gamma (branch metrics), alpha (forward recursion coefficients), beta (backward recursion coefficients), deltas (transition probabilities) of a turbo decoder.

The memory (120) stores the signal parameters. The memory (120) stores the information bits. The memory (120) may include non-volatile storage elements. Examples of such non-volatile storage elements may include magnetic hard discs, optical discs, floppy discs, flash memories, or forms of an Electrically Programmable Memory (EPROM) or an Electrically Erasable and Programmable Memory (EEPROM). In addition, the memory (120) may, in some examples, be considered a non-transitory storage medium. The term "non-transitory" may indicate that the storage medium is not embodied in a carrier wave or a propagated signal. However, the term "non-transitory" should not be interpreted that the memory (120) is non-movable. In some examples, the memory (120) can be configured to store larger amounts of information than the memory (120) respectively. In certain examples, a non-transitory storage medium may store data that can, over time, change (e.g., in Random Access Memory (RAM) or cache).

The processor (130) may include various processing circuitry and is configured to execute instructions stored in the memory (120). The processor (130) may be a general purpose processor, such as a Central Processing Unit (CPU), an Application Processor (AP), or the like, a graphics-only processing unit such as a Graphics Processing Unit (GPU), a Visual Processing Unit (VPU) and the like. The processor (130) may include multiple cores to execute the instructions. The communicator (160) is configured to communicate internally between hardware components in the electronic device (100). Further, the communicator (160) is configured to facilitate the communication between the electronic device (100) and other devices. The communicator (160) includes an electronic circuit specific to a standard that enables wired or wireless communication.

Although FIG. 3A shows the hardware components of the system (1000) it is to be understood that various embodiments are not limited thereon. In various embodiments, the system (1000) may include less or more number of components. Further, the labels or names of the components are used only for illustrative purpose and does not limit the scope of the disclosure. One or more components can be combined together to perform same or substantially similar function for early termination of the iterations in decoding the encoded data.

Figure 3B:
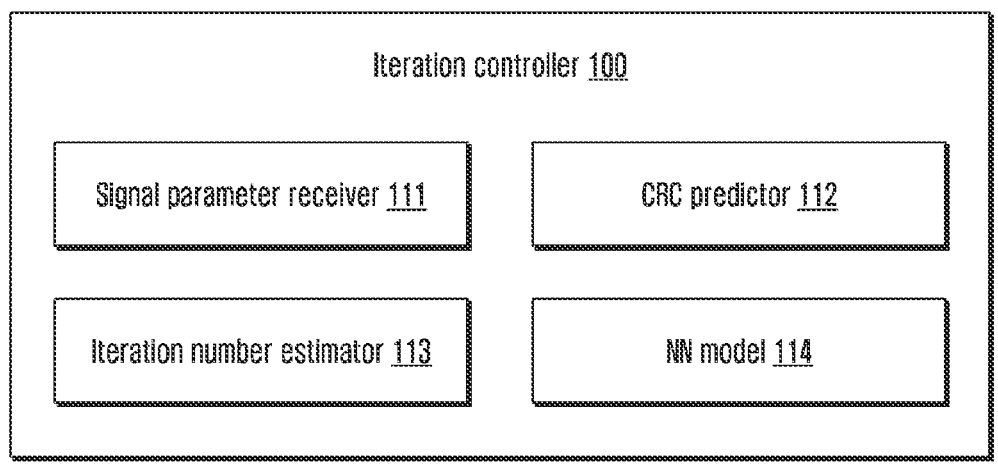
FIG. 3B is a block diagram illustrating an example configuration of an iteration controller for predicting a CRC failure or a CRC success or a CRC uncertainty in the iterations based on signal parameters using an NN model, according to various embodiments.

FIG. 3B is a block diagram illustrating an example configuration of the iteration controller (110) for predicting the CRC failure or the CRC success or the CRC uncertainty in the iterations based on the signal parameters using the NN model (114), according to various embodiments. In an embodiment, the iteration controller (110) includes a signal parameter receiver (111), an iteration number estimator (113), a CRC predictor (112), and the NN model (114), each of which may include various processing circuitry and/or executable program instructions. The signal parameter receiver (111) receives signal parameters associated with the encoded data for decoding the encoded data. The CRC predictor (112) predicts one of the CRC failure, the CRC success, and the CRC uncertainty in the iterations based on the signal parameters using the NN model (114). In an embodiment, the CRC predictor (112) trains the NN model (114) for the prediction.

The CRC predictor (112) determines the maximum number of iterations in decoding of the encoded data. The CRC predictor (112) estimates the first CRC status in the half of the maximum number of iterations based on the signal parameters. The CRC predictor (112) determines the second CRC status in the maximum number of iterations based on the signal parameters. The CRC predictor (112) trains the NN model (114) for the prediction based the match between the first CRC status and the second CRC status. The decoder (140) terminates decoding of the encoded data, in response to predicting the CRC failure in the iterations. The decoder (140) performs the next iteration in decoding of the encoded data, in response predicting the CRC uncertainty in the iterations. The iteration number estimator (113) determines the number of iterations required for obtaining the CRC success in the iterations based on the signal parameters using the NN model (114), in response to predicting the CRC success in the iterations.

Further, the decoder (140) converts the encoded data into a CRC added information data based on the number of iterations using the decoder (140). Further, the CRC controller (150) determines whether the CRC check on the CRC added information data is successful. The decoder (140) terminates decoding of the encoded data in response to determining that the CRC check on the CRC added information data is successful. Further, the CRC controller (150) obtains the information from the CRC added information data. The decoder (140) performs the next iteration in decoding of the encoded data, in response to determining that the CRC check on the CRC added information data is unsuccessful. In an embodiment, the NN model (114) scales up the internal metrics of the decoder (140) in each iteration for the successful early decoding of the encoded data.

At least one of the plurality of modules may be implemented through the NN model (114). A function associated with NN model (114) may be performed through the memory (120), and the processor (130).

The processor (130) may include one or a plurality of processors. At this time, one or a plurality of processors may be a general-purpose processor, such as a Central Processing Unit (CPU), an Application Processor (AP), or the like, a graphics-only processing unit such as a Graphics Processing Unit (GPU), a Visual Processing Unit (VPU), and/or an AI-dedicated processor such as a Neural Processing Unit (NPU).

In an embodiment, the one or a plurality of processors control processing of the input data in accordance with a predefined operating rule or NN model (114) stored in the memory (120). The predefined operating rule or NN model (114) is provided through training or learning.

Being provided through learning may refer, for example, to, by applying a learning method to a plurality of learning data, a predefined operating rule or NN model (114) of a desired characteristic being made. The learning may be performed in the electronic device (100) itself in which the ML according to an embodiment is performed, and/or may be implemented through a separate server/system. The learning method is a method for training a predetermined target device (for example, a robot, the electronic device (100) using a plurality of learning data to cause, allow, or control the target device to make a determination or prediction. Examples of learning methods include, but are not limited to, supervised learning, unsupervised learning, semi-supervised learning, or reinforcement learning.

The NN model (114) may include a plurality of neural network layers in the DNN. Each layer has a plurality of weight values, and performs a layer operation through calculation of a previous layer and an operation of a plurality of weights. Examples of neural networks include, but are not limited to, Convolutional Neural Network (CNN), Deep Neural Network (DNN), Recurrent Neural Network (RNN), Restricted Boltzmann Machine (RBM), Deep Belief Network (DBN), Bidirectional Recurrent Deep Neural Network (BRDNN), Generative Adversarial Networks (GAN), deep Q-networks, and a cascaded module includes each the CNN or the RNN or the DNN, where each layer with number of nodes >=1.

In an embodiment, the method can be used for determining stopping times of a turbo decoding using the NN model (114) in communication systems. The method includes predicting a convergence time or convergence iterations using the NN model (114) to avoid unnecessary check for a convergence in each step of the decoding. Therefore, the method decreases a number of cycles and cores required to perform a task. As the turbo decoding is an iterative process, knowing when to stop can reduce overheads immensely. The embodiments include providing a neural network based architecture for computing the stopping times.

All relevant inputs can be provided to the decoder (140), where the relevant inputs include a demodulated message and turbo code parameters (e.g. number of interleavers, an availability of tail biting, a length of a message, a length of parity bits, a memory map of a turbo code), and the CQI. The decoder (140) indicates a time instant at which the decoding needs to stop. The output of the decoder (140) is the number of iterations and a parameter number of iterations (N_est). In an embodiment, the relevant inputs can be fed to the decoder (140) that uses an iterative method. If the iterative method converges before a specified time 'T_iter', the electronic device (100) detects that the decoding process is completed. If the convergence is not achieved before the specified time 'T_iter', the signal parameter receiver (111) feedbacks the signal parameters to the NN model (114) to obtain an approximate value of N_est required. The iteration number estimator (113) checks whether the convergence has occurred or not. Further, the iteration number estimator (113) repeats iterations until achieving the convergence or reaching maximum iterations. Thus, the method significantly reduces a number of queries required.

Moreover, an initial estimate for the number of iterations can be determined using the AI model. In this manner a desired result can be obtained quickly. A square root and the decoder (140) will be queried less often, which speeds up the computation for the decoding.

In an example, inputs to the neural network are time, a Base Station Identity (BS ID), a frequency of operation, a day details, a location, a density of traffic, a distribution of traffic, climate conditions, special occasions, festivals and functions, calendar based events, vacation details/distribution, a User Equipment (UE) information, a UE type, a UE category, a UE monthly package, a data type information, signal measurements, offers in malls, movie release dates, sports events, school events, office events, etc.

Using the neural network model and the AI model, the electronic device (100) predicts the time for the convergence, and minimizes the number of the CRC checks. The CRC checks can be carried out after a predefined number of iterations (N_ini). A reduction in the overhead may refer, for example, to the maximum number of iterations (N_est) being increased to improve accuracy than what was allowed before. Intelligently allocating computing resources based on channel conditions of various users will improve decoding speed.

When more number of CPU/GPU cores are allocating for a particular task in the cloud systems, then processing can be done faster and vice versa. For example, at a given point of time t1, consider the ML/AI model (114) predicts that the decoding of the encoded data can be done in 4 iterations. Completing 4 iterations is a function of number of available free CPU/GPU cores. If more cores are available to run 4 iterations, the decoding takes less time and vice versa.

In another example, consider a maximum of 8 iterations are required to decode the encoded data in real time systems. The electronic device (100) won't try to run more than 8 iterations even though the decoding probability will be higher. If the predict number of iterations is less than 8, then the electronic device (100) tries to decode the data.

The prediction on the number of iteration is a function of the long/short term statistics of earlier prediction as a function of the MCS or the CQI or the SINR or the number of RBs. The prediction on the number of iteration be modeled as a Markova decision process problem, where a historic earlier decision is considered. All states of the Markov chain can be n-dimensional tuple, where n>=1. Simple Markov chain can be considered as a simple scheme that depends on only earlier decision.

Although FIG. 3B shows the hardware components of the iteration controller (110) but it is to be understood that other embodiments are not limited thereon. In other embodiments, the iteration controller (110) may include less or more number of components. Further, the labels or names of the components are used only for illustrative purpose and does not limit the scope of the disclosure. One or more components can be combined together to perform same or substantially similar function for predicting the CRC failure or the CRC success or the CRC uncertainty in the iterations.

Figure 4:
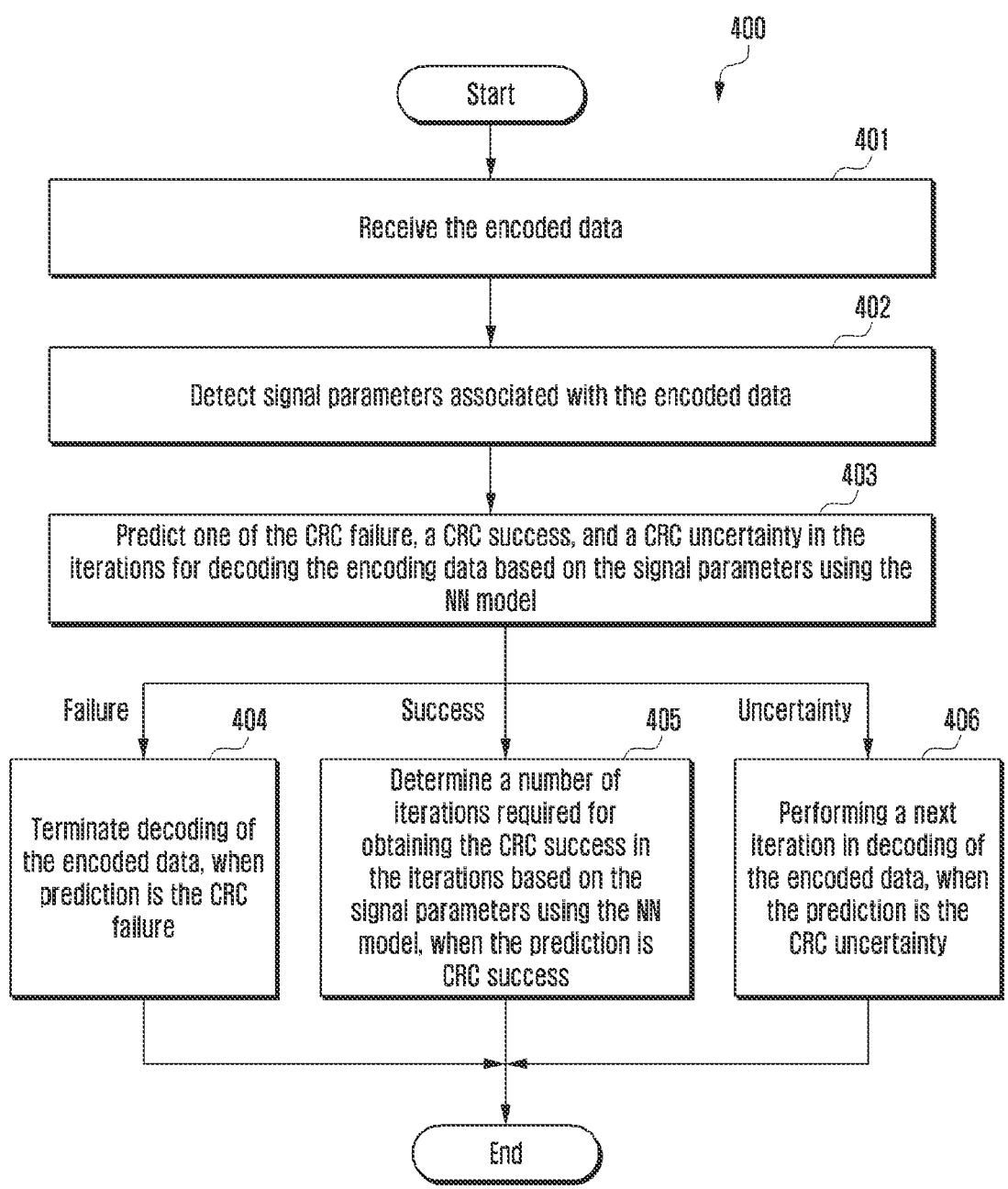
FIG. 4 is a flowchart illustrating an example method for early termination of the iterations in decoding the encoded data, according to various embodiments.

FIG. 4 is a flowchart 400 illustrating an example method for early termination of the iterations in decoding the encoded data, according to various embodiments. At 401, the method includes receiving the encoded data. In an embodiment, the method allows the signal parameter receiver (111) to receive the encoded data. At 402, the method includes detecting the signal parameters associated with the encoded data. In an embodiment, the method allows the signal parameter receiver (111) to detect the signal parameters associated with the encoded data. At 403, the method includes predicting one of the CRC failure, the CRC success, and the CRC uncertainty in the iterations for decoding the encoded data based on the signal parameters using the NN model (114). In an embodiment, the method allows the CRC predictor (112) to predict one of the CRC failure, the CRC success, and the CRC uncertainty in the iterations for decoding the encoded data based on the signal parameters using the NN model (114).

At 404, the method includes terminating decoding of the encoded data, when prediction is the CRC failure. In an embodiment, the method allows the decoder (140) to terminate decoding of the encoded data, when the prediction is the CRC failure. At 405, the method includes determining the number of iterations required for obtaining the CRC success in the iterations based on the signal parameters using the NN model (114), when the prediction is the CRC success. In an embodiment, the method allows the iteration number estimator (113) to determine the number of iterations required for obtaining the CRC success in the iterations based on the signal parameters using the NN model (114), when the prediction is the CRC success. At 406, the method includes performing the next iteration in decoding of the encoded data, when the prediction is the CRC uncertainty. In an embodiment, the method allows the decoder (140) to perform the next iteration in decoding of the encoded data, when the prediction is the CRC uncertainty.

The various actions, acts, blocks, steps, or the like in the flowchart 400 may be performed in the order presented, in a different order or simultaneously. Further, in some embodiments, some of the actions, acts, blocks, steps, or the like may be omitted, added, modified, skipped, or the like without departing from the scope of the disclosure.

Figure 5:
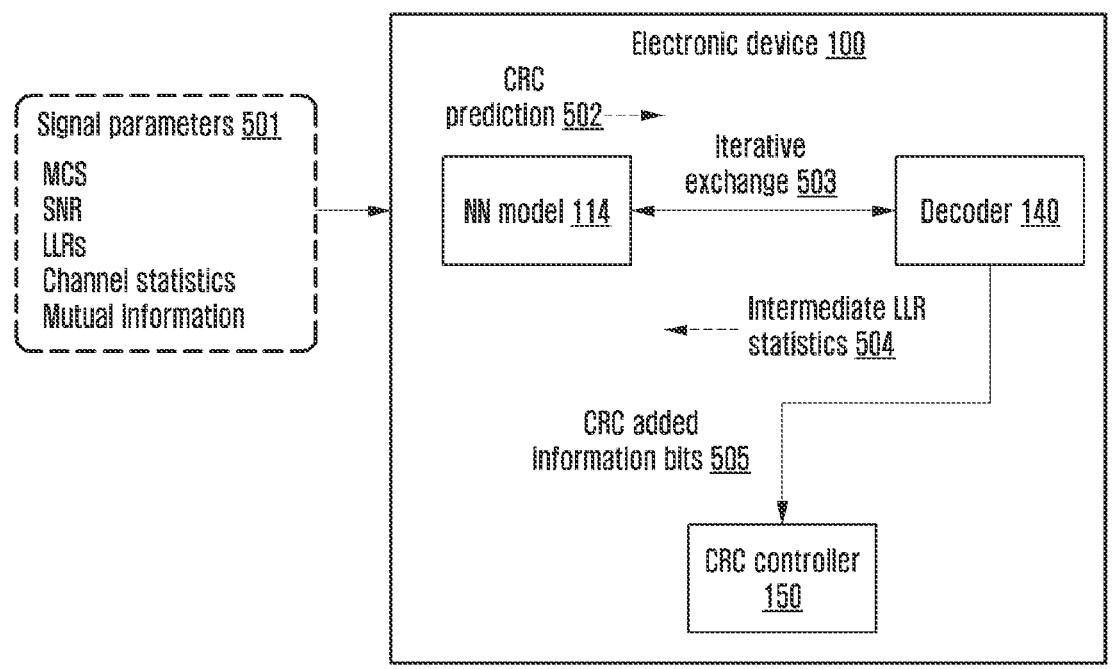
FIG. 5 is a diagram illustrating an example architecture of the electronic device for predicting CRC failure or CRC success in the iterations by applying the signal parameters to the NN model, according to various embodiments.

FIG. 5 is an architectural diagram illustrating an example electronic device (100) for predicting the CRC failure or the CRC success in the iterations by applying the signal parameters to the NN model (114), according to various embodiments. The NN model (114) receives the signal parameters (501) includes the MCS, the SNR, the LLRs, the channel statistics, and the mutual information from the signal parameter receiver (111). The decoder (140) performs one iteration using the LLRs and forwards the processed LLRs (e.g., the intermediate LLR statistics) to the NN model.

The NN model (114) receives the intermediate LLR statistics from the decoder (140). The CRC predictor (112) of the electronic device (100) predicts (502) the CRC success or the CRC failure using the NN model (114) based on the signal parameters (501) and the intermediate LLR statistics (504). Further, the NN model (114) performs an iterative exchange (503) with the decoder (140) by sending the LLRs of the codeword to the decoder (140), in response to predicting the CRC success. Further, the decoder (140) generates the CRC added information bits (505) and forwards the CRC added information bits to the CRC controller (150). Further, the CRC controller (150) generates the CRC bits using the CRC added information bits obtained from the decoder (140) and checks (18) if the remainder is zero to verify the prediction of the NN model (114).

Figure 6:
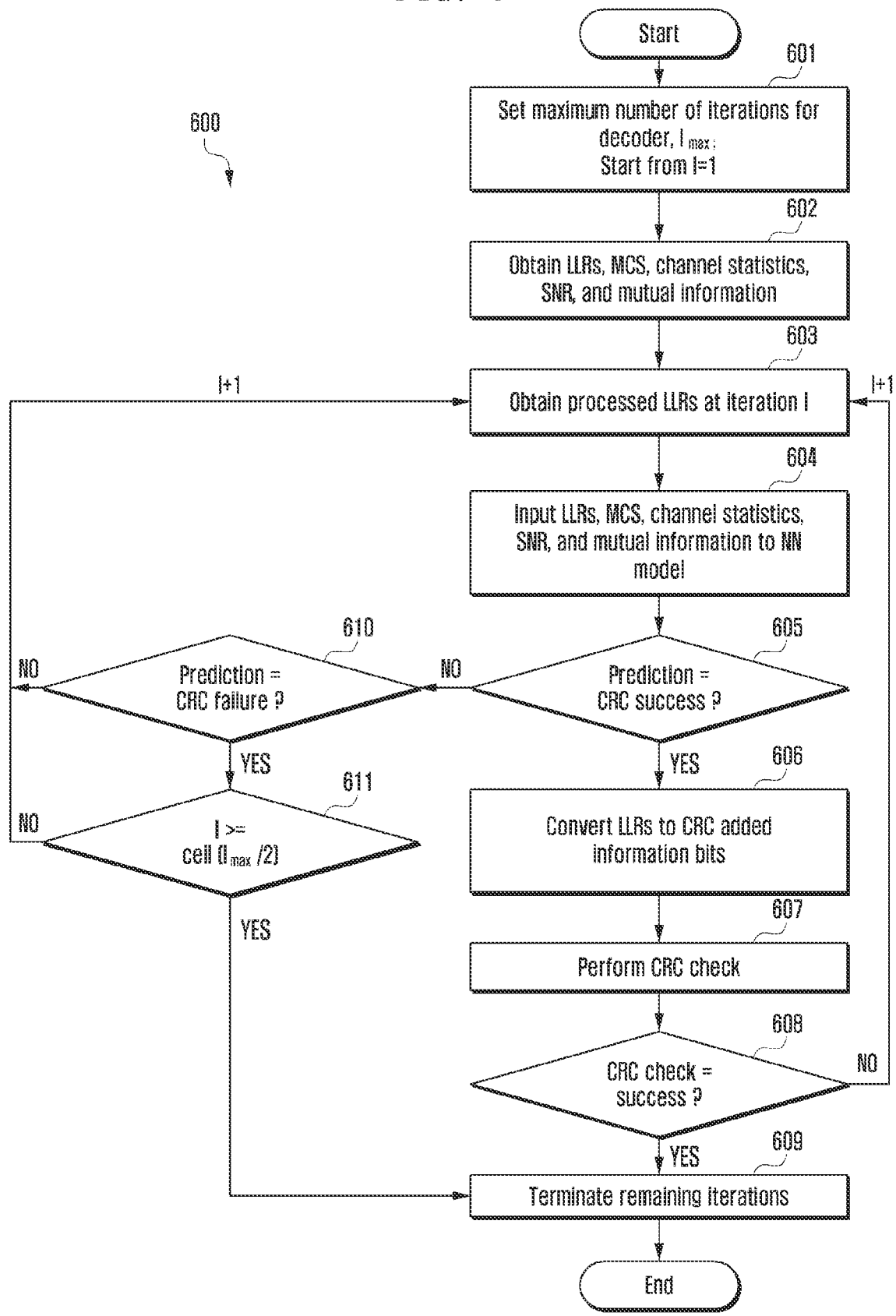
FIG. 6 is a flowchart illustrating an example method for predicting the CRC failure or the CRC success in the iterations based on the signal parameters, according to various embodiments.

FIG. 6 is a flowchart 600 illustrating an example method for predicting the CRC failure or the CRC success in the iterations based on the signal parameters (501), according to various embodiments. At 601, the iteration number estimator (113) sets a maximum number (e.g., Imax) of iterations for the decoder (140) and sets to start from a first iteration (e.g., I=1). At 602, the signal parameter receiver (111) obtains the LLRs, the MCS, the channel statistics, the SNR, and the MI. At 603, the decoder (140) performs the first iteration using the LLRs and obtains the processed LLRs (e.g., the intermediate LLR statistics). At 604, the signal parameter receiver (111) inputs the LLRs, the MCS, the channel statistics, the SNR, and the MI to the NN model (114) for the predication.

At 605, the CRC predictor (112) determines whether the prediction is the CRC success. At 606, the decoder (140) converts the LLRs into the CRC added information bits, in response to determining that the prediction is the CRC success. At 607, the CRC controller (150) performs CRC check by generating the CRC bits using the CRC added information bits obtained from the decoder (140) and checks (18) if the remainder is zero to verify the prediction of the NN model (114). The CRC check is success if the remainder is zero. The CRC check is failure if the remainder is non-zero. At 608, the CRC controller (150) determines whether the CRC check is success. At 609, the decoder (140) terminates the remaining iterations in the decoding and running of the NN model (114), in response to determining that the CRC check is success. In response to determining that the CRC check is failure, the decoder (140) continues to perform the step 603 for the next iteration in the decoding for minimizing an information loss due to a false prediction.

At 610, the CRC predictor (112) determines whether the prediction is CRC failure, in response to detecting that the prediction is not CRC success. In response to determining that the prediction is not CRC failure, decoder (140) continues to perform the step 603 for the next iteration in the decoding. At 611, the CRC predictor (112) determines whether the current number of iteration is greater than or equal to a half of ceil of the maximum number (e.g., Imax) of iterations. In response to determining that the current number of iteration is smaller than the half of ceil of the maximum number of iterations, the decoder (140) continues to perform the step 603 for the next iteration in the decoding. In response to determining that the current number of iteration is greater than or equal to the half of ceil of the maximum number of iteration, the decoder (140) continues to perform the step 609.

Figure 7A:
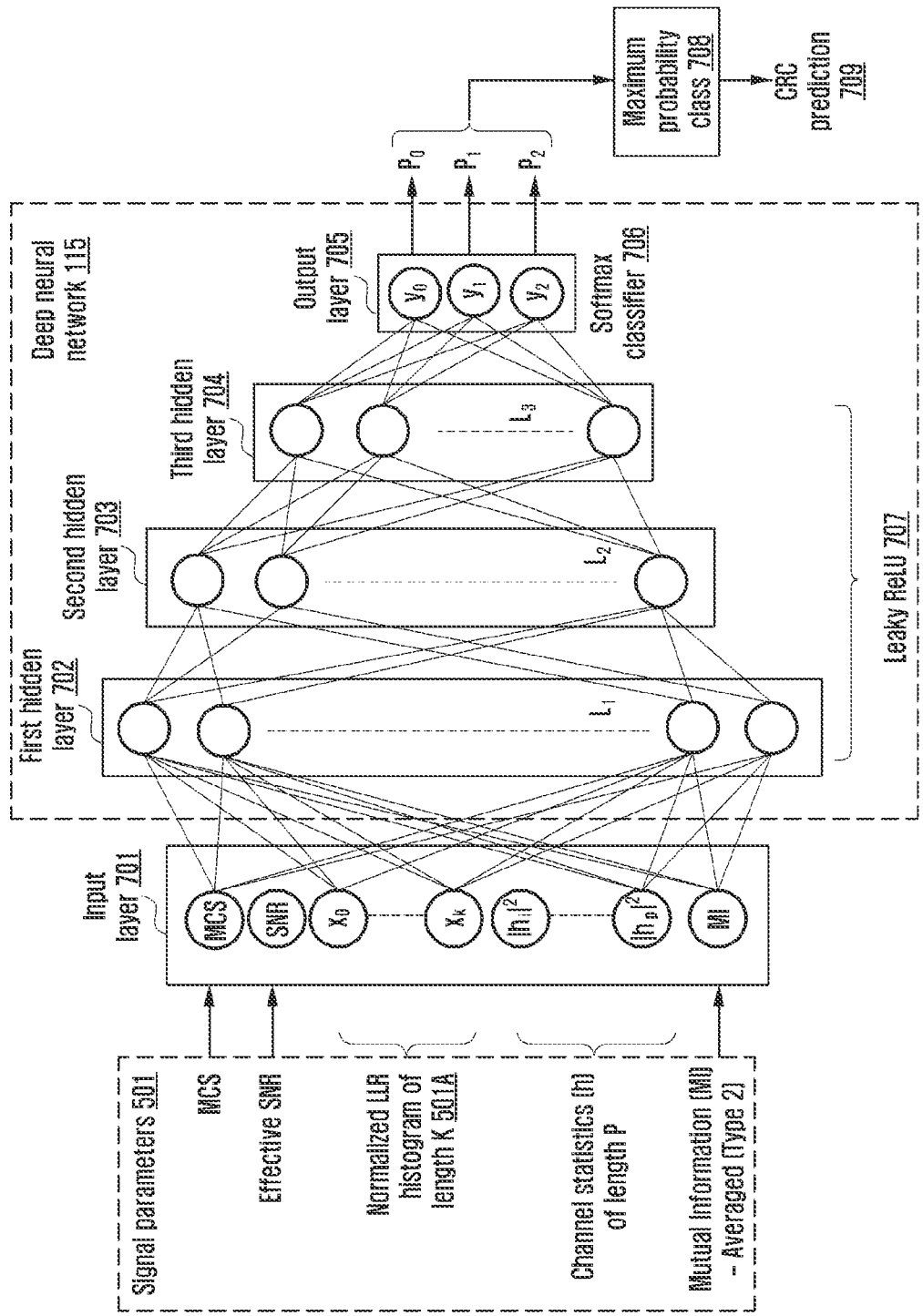
FIG. 7A is a diagram illustrating an example architecture of the NN model for predicting the CRC failure or the CRC success in the iterations using the signal parameters and a normalized LLR histogram at each iteration, according to various embodiments.

FIG. 7A is an architectural diagram illustrating an example of the NN model (114) for predicting the CRC failure or the CRC success in the iterations using the signal parameters (501) and the normalized LLR histogram (501A) at each iteration, according to various embodiments. A fully connected DNN (115) based NN model (114) is shown in FIG. 7A. The NN model (114) includes the input layer (701), the fully connected DNN (115) and a maximum probability class (708), where the fully connected DNN (115) includes the output layer (705) with softmax classifier (706) for the three classes of the CRC prediction (709), and three hidden layers (702, 703, 704) with the leaky ReLU activation functions (707). The maximum probability class is a function that computes a maximum of all the probabilities obtained from the NN model (114).

The input layer (701) includes nodes, where each node is configured to receive the signal parameters (501) assigned to each node. Nodes assigned to receive the channel statistics will determines a square of absolute value of the channel statistics for further processing. A first hidden layer (702) includes L1 neural blocks. A second hidden layer (703) includes L2 neural blocks. A third hidden layer (704) includes L3 neural blocks. y0, y1, and y2 are the classifiers (706), where y0 indicates the first class of the CRC prediction (e.g., p0), y1 indicates the second class of the CRC prediction (e.g., p1), and y2 indicates the third class of the CRC prediction (e.g., p2). The input layer (701) provides its output as an input to the first hidden layer (702). The first hidden layer (702) provides its output as an input to the second hidden layer (703). The second hidden layer (703) provides its output as an input to the third hidden layer (704). The second hidden layer (703) provides its output as an input to the output layer (705). The maximum probability class (708) determines the CRC prediction (709) e.g., CRC failure or the CRC success based on the three classes, e.g., p0, p1, and p2.

Figure 7B:
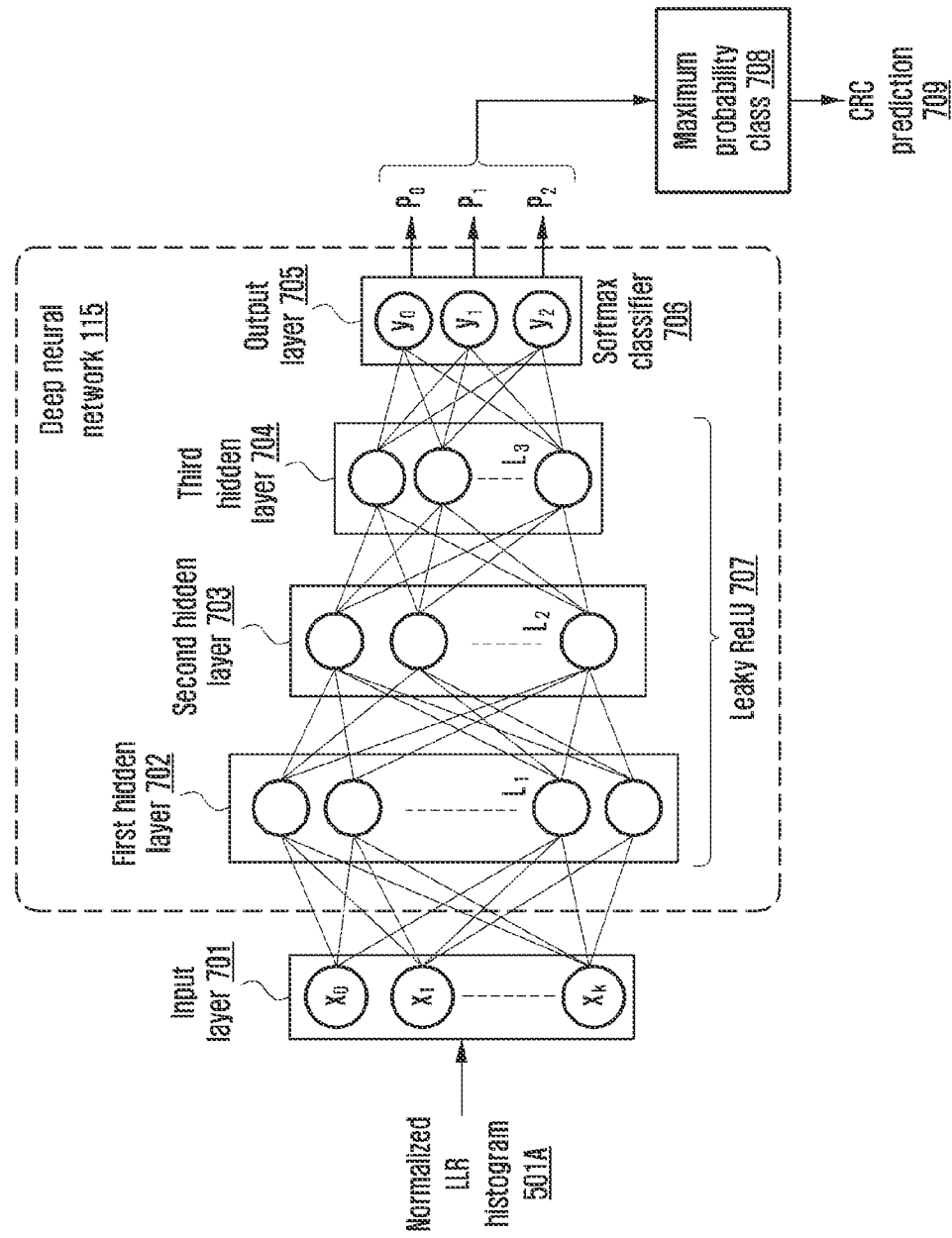
FIG. 7B is a diagram illustrating an example architecture the NN model for predicting the CRC failure or the CRC success in the iterations using the normalized LLR histogram, according to various embodiments.

FIG. 7B is an architectural diagram illustrating an example of the NN model (114) for predicting the CRC failure or the CRC success in the iterations using the normalized LLR histogram (501A), according to various embodiments. A fully connected DNN (115) based NN model (114) is shown in FIG. 7B. The NN model (114) includes the input layer (701), the fully connected DNN (115) and the maximum probability class (708), where the fully connected DNN (115) includes the output layer (705) with softmax classifier (706) for the three classes (e.g., p0, p1, and p2) of the CRC prediction (709), and three hidden layers (702, 703, 704) with the leaky ReLU activation functions (707). The input layer (701) includes nodes configured to receive the normalized LLR histogram (501A). The first hidden layer (702) includes the L1 neural blocks. The second hidden layer (703) includes the L2 neural blocks. The third hidden layer (704) includes the L3 neural blocks. y0, y1, and y2 are the softmax classifier (706), where y0 indicates the first class of the CRC prediction (e.g., p0), y1 indicates the second class of the CRC prediction (e.g., p1), and y2 indicates the third class of the CRC prediction (e.g., p2). The input layer (701) provides its output as the input to the first hidden layer (702). The first hidden layer (702) provides its output as the input to the second hidden layer (703). The second hidden layer (703) provides its output as the input to the third hidden layer (704). The second hidden layer (703) provides its output as the input to the output layer (705). The maximum probability class (708) determines the CRC prediction (709) e.g., CRC failure or the CRC success based on the three classes, e.g., p0, p1, and p2.

In an embodiment, the electronic device (100) terminates the decoding if the DNN (115) predicts the normalized LLR histogram (501A) as the CRC failure. An LLR histogram (501A) corresponds to the CRC failure when the normalized LLR histogram (501A) doesn't converge over the iterations. The NN model (115) learns a divergence over the iterations and chooses to consider the CRC failure predictions only at the half of the maximum possible iterations (e.g., $$\left\lfloor \frac{I_{MAX}}{2} \right\rfloor\right)$$

for the decoder (140). Therefore, an information loss can be avoided due to false predictions of the CRC failure during initial iterations.

Turbo decoder and a LDPC decoder are the decoders (140) chosen by third generation partnership project (3GPP) for decoding in a Long-Term Evolution (LTE) and a New Radio (NR) cellular technologies respectively. An additional complexity for executing the NN model (114) for the turbo/LDPC decoder includes a computational complexity of the normalized histogram of the LLRs (501A), a computational complexity in executing the NN model (114), and a computational complexity in the CRC check for the CRC success prediction. The computational complexity can be determined using a multiplication, an addition, a comparison and a division, which are considered as a Floating-Point Operations (FLOPs).

The computational complexity of the normalised histogram of the LLRs (501A): A number of the FLOPs required to obtain the normalized histogram with K bins for the codeword of length N is ~NK comparisons (for binning) and K divisions (for normalization). Therefore, the complexity for computing the normalized histogram in terms of the number of the FLOPs can be approximately written as $X_{Hist}$=NK+K=(N+1)K.

The computational complexity in executing the NN model (114): For executing the DNN, the number of FLOPs required for computations of weight multiplications, additions, comparisons and the activation functions for all the layers can be approximately written as $X_{DNN}$=(KL$_1$+L$_1$L$_2$+L$_2$L$_3$+3L$_3$+K+L$_1$+L$_2$+L$_3$+12) FLOPs, where '12' corresponds to a sigmoid function evaluation using softmax activation where each node computation requires approximately 4 FLOPs. L1 are the neural blocks present in the first hidden layer (702). L2 are the neural blocks present in the second hidden layer (703). L3 are the neural blocks present in the third hidden layer (704).

A computational complexity in the CRC check for the CRC success prediction: The CRC check is a binary division where N bit codeword is divided using a CRC polynomial. The computational complexity in the CRC check can be approximately written as $$X_{CRC} = \frac{N}{P} \; FLOPs$$

where p is the number of bits considered in one FLOP.

Therefore, the total complexity of NN model decoder architecture in terms of p-bit FLOPs is $$X = X_{Hist} + X_{DNN} + X_{CRC} =$$
$$(N+1)K + KL_1 + L_1L_2 + L_2L_3 + 3L_3 + K + L_1 + L_2 + L_3 + 12 + \frac{N}{P}.$$

If one iteration of the turbo/LDPC decoder has complexity Y, then a total power savings in terms of computational complexity can be written as, $$\text{power savings} = \frac{I_{MAX}Y - (ANI(X+Y))}{I_{MAX}Y} * 100.$$

$I_{MAX}$ is the maximum number of iterations required for a fixed implementation of the decoder (140) and ANI is an average number of iterations obtained with the proposed ML based method.

In an example scenario, let (K, $L_1$, $L_2$, $L_3$)=(20, 40, 30, 15) for the LDPC decoder, then the $X_{DNN}$=2600, and $$X_{LDPC} = (N+1)20 + 2600 + \left\lceil \frac{N}{P} \right\rceil.$$

In an example scenario, let (K, $L_1$, $L_2$, $L_3$)=(20, 40, 20, 10) for the turbo decoder, then the $X_{DNN}$=1900, and the $$X_{Turbo} = (N+1)20 + 1900 + \left\lceil \frac{N}{P} \right\rceil.$$

Figure 7C:
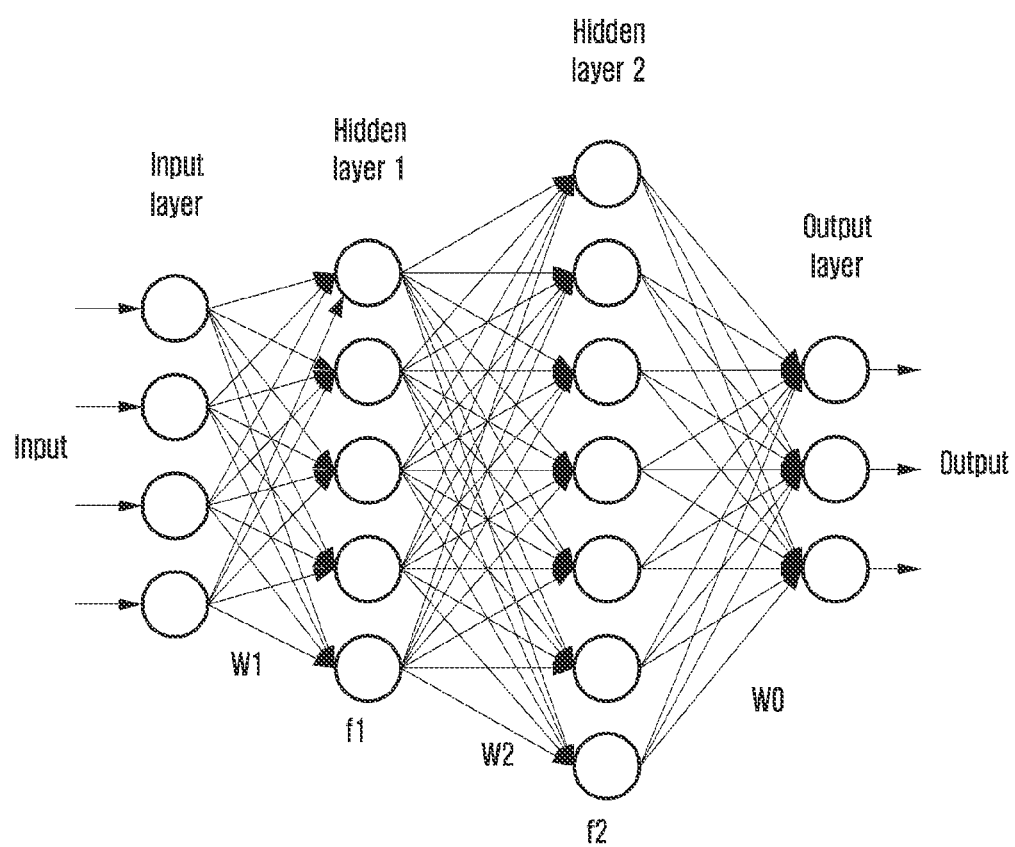
FIG. 7C is a diagram illustrating example inputs to the neural network for decoding, according to various embodiments.
Figure 7D:
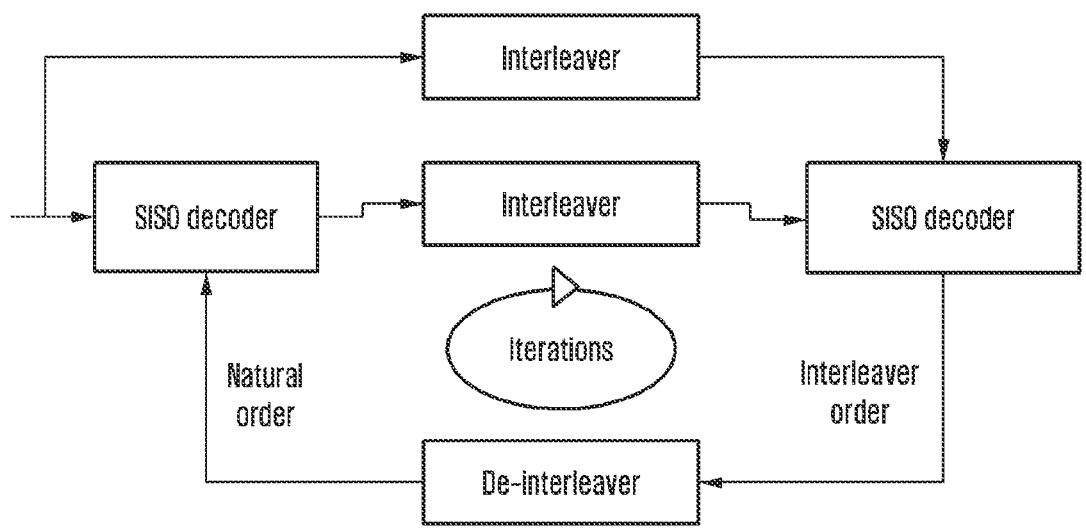
FIG. 7D is a diagram illustrating an example configuration of the turbo decoder, according to various embodiments.

FIG. 7C is a diagram illustrating example inputs to the neural network for decoding, according to various embodiments. As depicted in FIG. 7C, the inputs to the neural network are a demodulated inputs, a error tolerance, a message length, a memory map of turbo code, a number of interleavers, the CQI, and the MCS. The output of the neural network is the number of iterations (N_est). FIG. 7D illustrates an example of the turbo decoder, according to various embodiments.

Figure 7E:
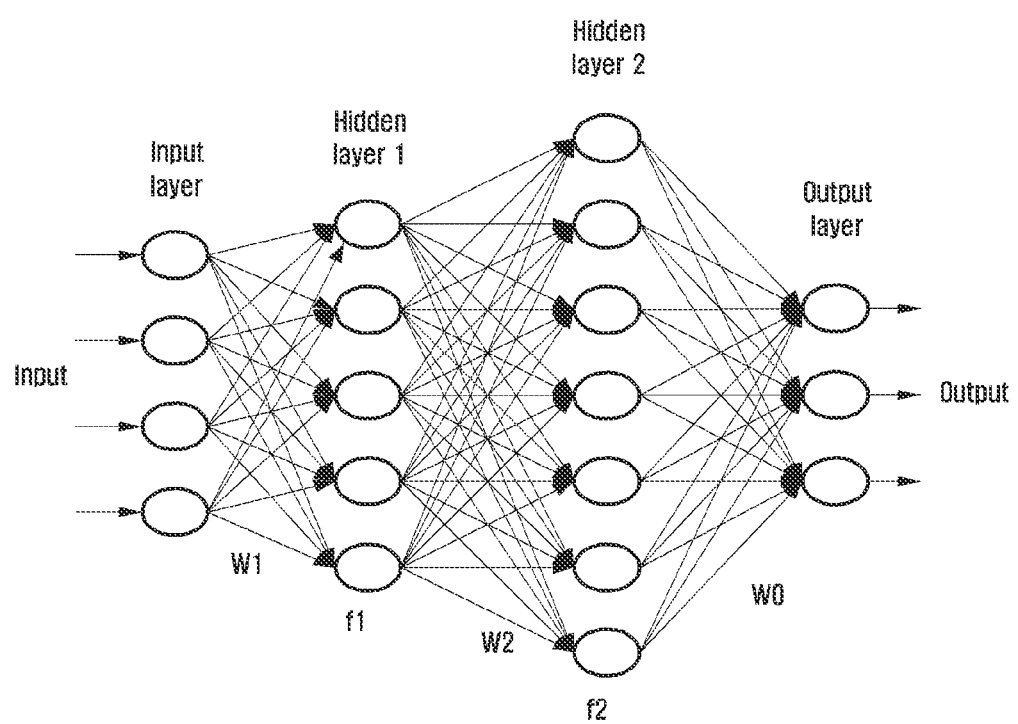
FIGS. 7E, 7F and 7G are diagrams illustrating example cascaded neural network architectures for decoding, according to various embodiments.
Figure 7F:
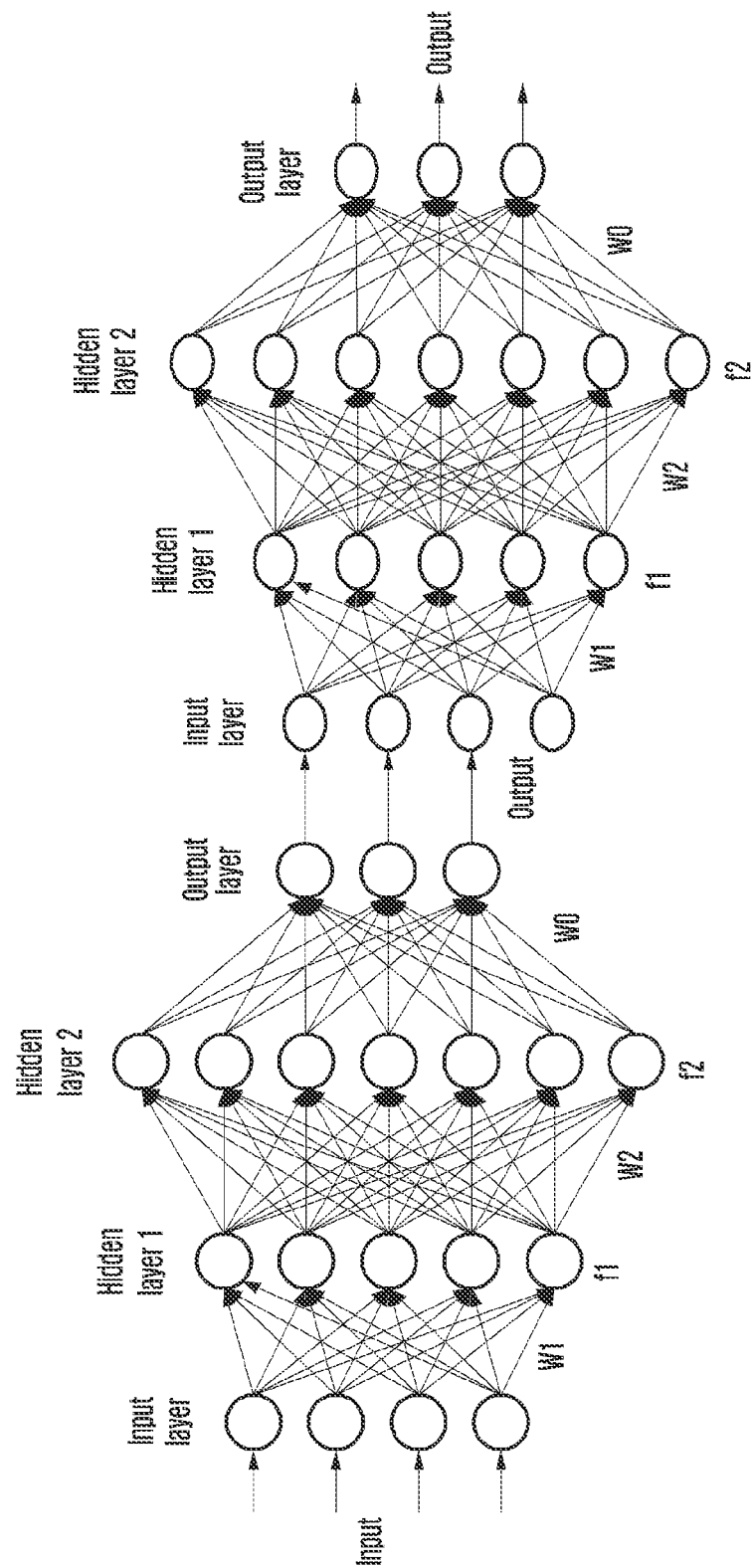
Figure 7G:
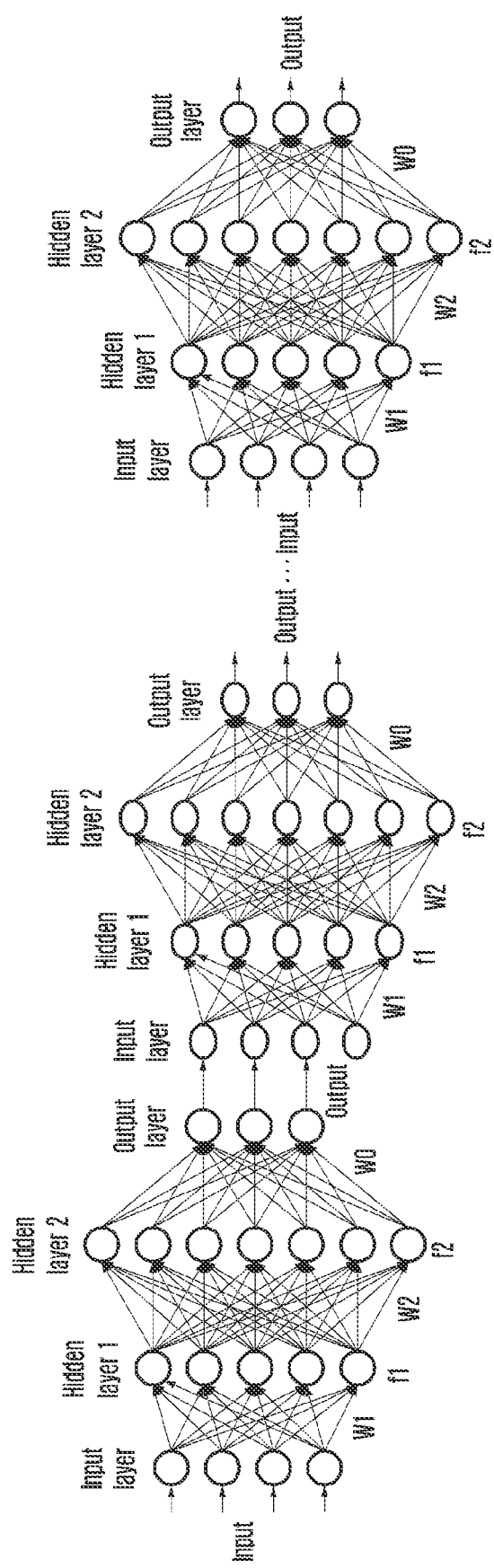

FIGS. 7E, 7F and 7G illustrates a cascaded neural network architectures for decoding, according to embodiments as disclosed herein. The NN model (114) includes varied number of neural networks for different N_ini, which allows the individual neural networks to be less complex. The neural networks can be Deep Neural Network (DNN) or Convolutional Neural Network (CNN). FIG. 7E depicts the neural network for N_ini as 1. Similarly, FIG. 7F and FIG. 7G depict the neural network for N_ini as 2 and K respectively. With increase in N_ini, cascading is done.

FIG. 7H is a diagram illustrating activation functions used in the neural network, according various embodiments. In an embodiment, Rectified Linear Unit (ReLU) activation function can be used in learning the weights of the neural network in the training phase of the simulations of the neural network. Other activation functions can also be used for simulation.

Once a trained neural network is obtained, the computation complexity is reduced. This is because the hardware of the neural network includes adders and multipliers. The nonlinear activation functions involved are sigmoid and the ReLU. The ReLU activation function is max (x, 0) function. This is the function of a comparator, which is implementable. The sigmoid function is 1/1+e−x. The sigmoid function is having a piecewise approximation, which may be used for reducing the complexity. Thus, the complexity of a neural network implementation can be reduced. While training the neural network functions such as ReLU activation function, the sigmoid functions can be used. However, while deploying the neural network, piecewise linear approximations can be used wherever applicable.

Figure 8:
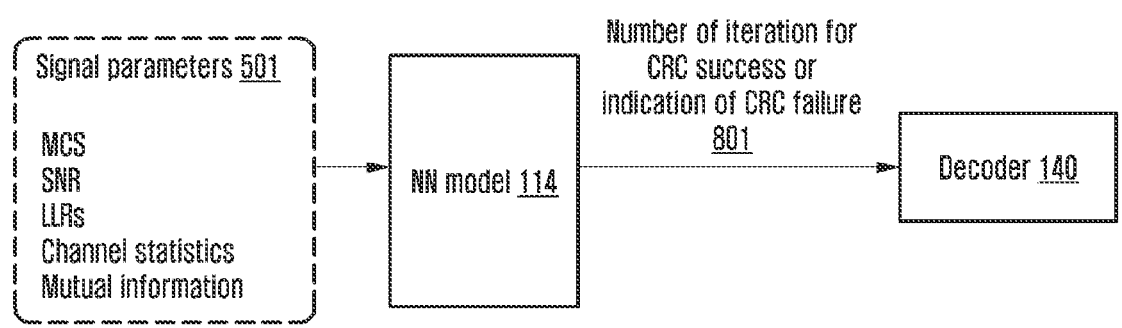
FIG. 8 is a diagram illustrating an example method for determining a number of iteration required for the CRC success or an indication of the CRC failure based on the signal parameters, according to various embodiments.

FIG. 8 is a diagram illustrating an example method for determining the number of iteration required for the CRC success or an indication of the CRC failure based on the signal parameters (501), according to various embodiments. The NN model receives the signal parameters (501) from the signal parameter receiver (111). Further, the CRC predictor (112) indicates (801) the decoder (140) about either the number of iterations required to run the decoder (140) for the CRC success or not running the decoder (140) for the CRC failure. Therefore, the method allows the electronic device (100) to significantly reduce the power consumption in the decoding process.

Figure 9:
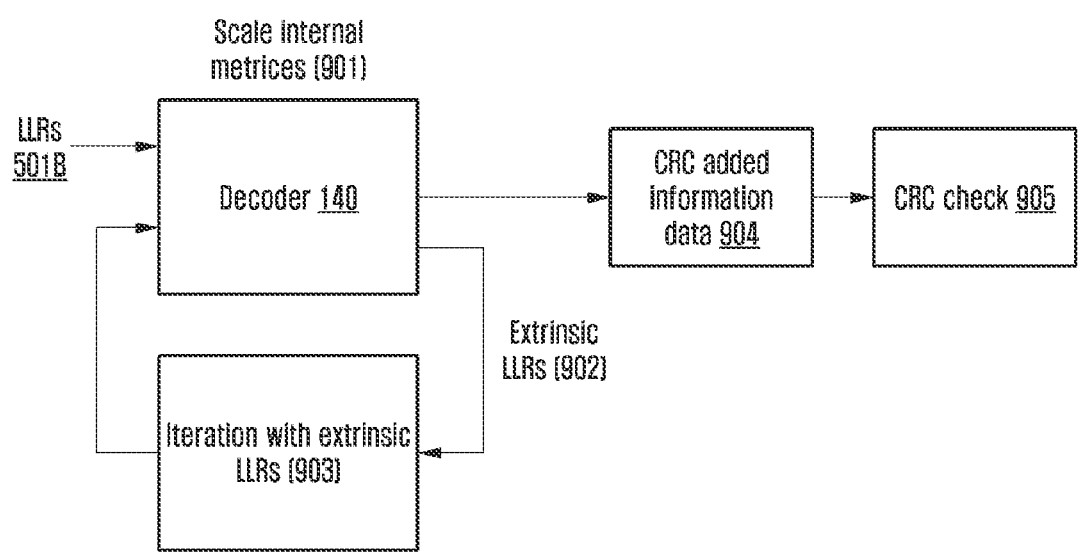
FIG. 9 is a diagram illustrating an example method for accelerating the decoding of the encoded data, according to various embodiments.

FIG. 9 is a diagram illustrating an example method for accelerating the decoding of the encoded data, according to various embodiments. The decoder (140) receives the apriori LLRs (501B). The NN model (114) scales the internal metrics (901) of the decoder (140). Further, the decoder (140) generates extrinsic LLRs (902) using the apriori LLRs (501B) as per the scaled internal metrics (901) and performs (903) the iteration with the extrinsic LLRs (902). Further, the decoder (140) generates the CRC added information data (904) after the iteration. Further, the CRC controller 150 performs CRC check (905) on the CRC added information data (904) to verify the prediction of the CRC success.

Figure 10:
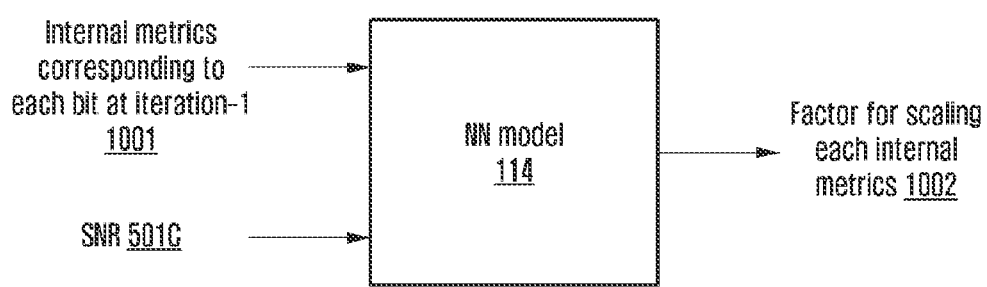
FIG. 10 is a diagram illustrating an example method of determining factors for scaling internal metrics of the decoder, according to an various embodiments.
Figure 11:
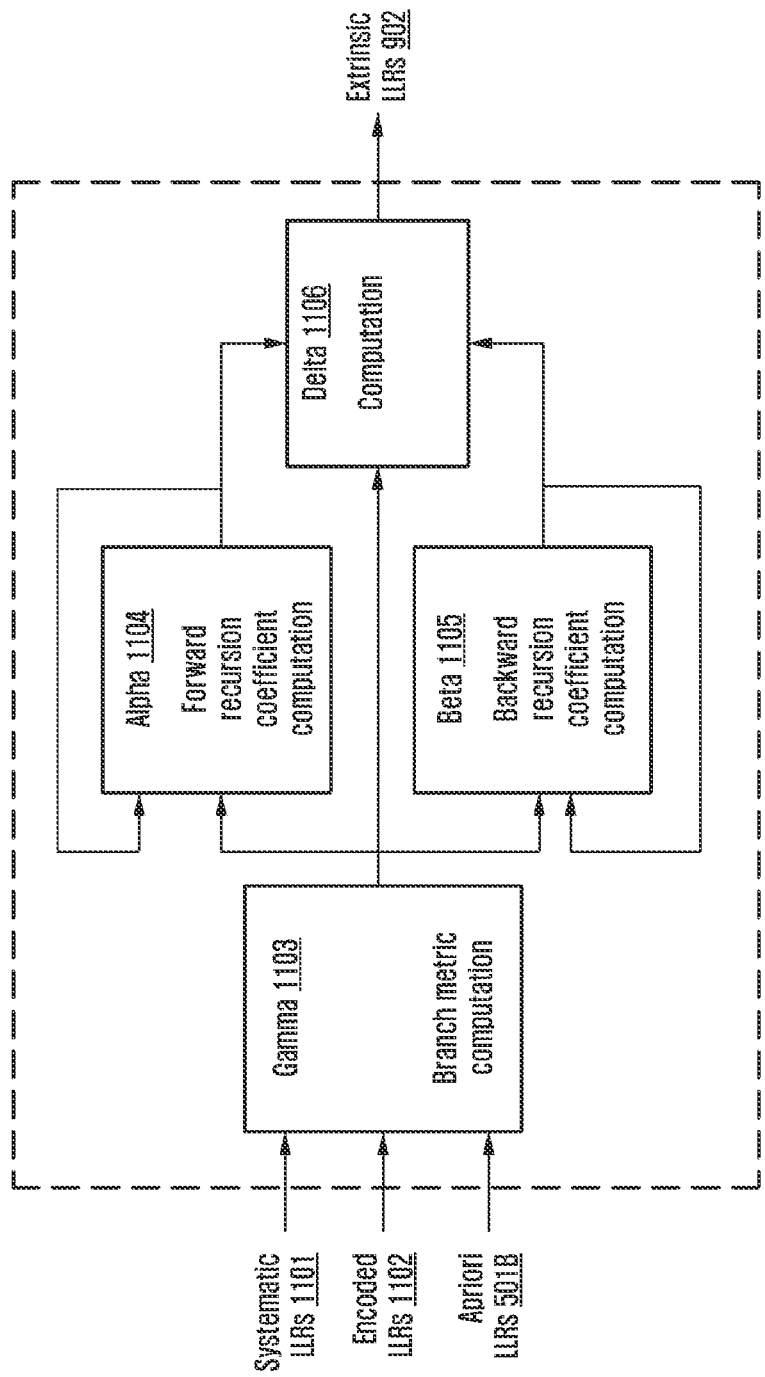
FIG. 11 is a diagram illustrating an example method of accelerating the decoding of the encoded data by scaling the internal metrics, according to various embodiments.

In response to scaling up the internal metrics (901) of the decoder (140) in each iteration, the CRC predictor (112) can early predict the CRC success, which allows the decoder (140) to early decode success of the codeword and save significant amount of power consumed for the decoding process FIG. 10 is a diagram illustrating an example method of determining factors for scaling the internal metrics of the decoder (140), according to an embodiment as disclosed herein. The NN model (114) obtains the internal metrics of the decoder (140) that correspond to the successful decoding at iteration 'I' equal to 1 and $I_{MAX}$ (1001). Further, the CRC predictor (112) trains the NN model (114) using the internal metrics along with the SNR (501C) to output the scaling factors (1002) for each internal metrics FIG. 11 is a diagram illustrating an example method of accelerating the decoding of the encoded data by scaling the internal metrics, according to various embodiments. The internal metrics of the decoder (140) are the gamma (1103), the alpha (1104), the beta (1105) and delta (1106). The gamma (1103) receives systematic LLRs (1101), encoded LLRs (1102) and the apriori LLRs (501B) and determines a branch metric using the systematic LLRs (1101), the encoded LLRs (1102) and the apriori LLRs 501B. Further, the gamma (1103) sends the branch metric to the alpha (1104), the beta (1105), and the delta (1106). The alpha (1104) determines a forward recursion coefficient and sends the forward recursion coefficient to the delta (1106). The alpha (1104) uses the forward recursion coefficient in one iteration for computation of forward recursion coefficient for next iteration. The beta (1105) determines a backward recursion coefficient and sends the beta (1105) recursion coefficient to the delta (1106). The beta (1105) uses the backward recursion coefficient in one iteration for computation of a backward recursion coefficient for next iteration. The delta (1106) performs computation using the forward recursion coefficient and the backward recursion coefficient in one iteration to generate the extrinsic LLRs (902). The NN model (114) scales the internal metrics gamma (1103), the alpha (1104), the beta (1105) and delta (1106) for completing the decoding at an earlier iteration K<N where N is the fixed number of iterations.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device configured to predict iterations for decoding an encoded data, comprising:
a memory;
a processor;
a decoder; and
an iteration controller coupled to the memory and the processor, configured to:
receive the encoded data;
detect at least one signal parameter associated with the encoded data; and
predict one of a Cyclic Redundancy Check (CRC) failure, a CRC success, and a CRC uncertainty in iterations for decoding the encoded data based on the at least one signal parameter using a Neural Network (NN) model.

2. The electronic device as claimed in claim 1, wherein the iteration controller is further configured to perform one of:
terminating decoding of the encoded data in response to predicting the CRC failure in the iterations;
determining a number of iterations required for obtaining the CRC success in the iterations based on the at least one signal parameter using the NN model in response to predicting the CRC success in the iterations; and
performing a next iteration in decoding of the encoded data in response to predicting the CRC uncertainty in the iterations.

3. The electronic device as claimed in claim 2, wherein determining the number of iterations required for obtaining the CRC success comprises:
determining a time required for the CRC success by the number of iterations;
terminating decoding of the encoded data in response to detecting that the time required for the CRC success by the number of iterations is greater than a threshold time; and
decoding the encoded data by the number of iterations in response to detecting that the time required for the CRC success by the number of iterations is lesser than the threshold time.

4. The electronic device as claimed in claim 3, wherein the threshold time is determined based on the signal parameters, encoding and decoding capabilities, a latency requirement, network conditions, a temperature, and a network load.

5. The electronic device as claimed in claim 3, wherein the iteration controller is further configured to:
convert the encoded data into a CRC added information data based on the number of iterations using the decoder;
determine whether a CRC check on the CRC added information data is successful; and
perform one of:
terminating decoding of the encoded data, and obtaining information data from the CRC added information data in response to determining that the CRC check on the CRC added information data is successful, and
performing a next iteration in decoding of the encoded data in response to determining that the CRC check on the CRC added information data is unsuccessful.

6. The electronic device as claimed in claim 5, wherein scaling up internal metrics of the decoder in each iteration causes successful early decoding of the encoded data.

7. The electronic device as claimed in claim 1, wherein the NN model is configured to be trained for the prediction by:
determining a maximum number of iterations in decoding of the encoded data;
estimating a first CRC status in a half of the maximum number of iterations based on the at least one signal parameter, wherein the first CRC status is one of the CRC success and the CRC failure;
determining a second CRC status in the maximum number of iterations based on the at least one signal parameter, wherein the second CRC status is one of the CRC success and the CRC failure; and
training the NN model for the prediction based a match between the first CRC status and the second CRC status.

8. The electronic device as claimed in claim 1, wherein the at least one signal parameter comprises at least one of: a Modulation and Coding Scheme (MCS), a Signal-to-Noise Ratio (SNR), a long term IIR/FIR filtered statistics, a short term IIR/FIR filtered statistics, a distribution of the long term IIR/FIR filtered statistics, a distribution of the short term IIR/FIR filtered statistics, a Signal-to-Interference-Noise Ratio (SINR), an expected SINR, Channel State Information (CSI), a Multiple-Input and Multiple-Output (MIMO) transmission mode, a MIMO rank, an operating frequency, a capability of the electronic device, an earlier prediction info long/short/filtered statistics, resource blocks, Quality of Service (QoS) Class Identifier (QCI), a transmission mode, a Channel quality indicator (CQI) of a wideband, a sub-band CQI, a M-sub-band CQI, a Rank Indicator (RI), a Precoding Matrix Indicator (PMI), an Instantaneous Channel Statistics (h), an Averaged Mutual Information (MI), an intermediate Log Likelihood Ratio (LLR) statistics of the decoder, an apriori LLRs of the encoded data, or a normalized histogram of the LLRs.

9. The electronic device as claimed in claim 1, wherein the NN model comprises an input layer, an output layer including a classifier for three classes of CRC prediction, and three hidden layers with leaky rectified linear unit (ReLU) activation functions and a plurality of neural blocks in each layer.

10. The electronic device as claimed in claim 1 wherein the encoded data includes one among codes corresponding to an iterative decoder include at least one of a Low-Density Parity Check (LDPC) code and a turbo code.

11. The electronic device as claimed in claim 1, wherein the prediction includes the CRC uncertainty based on the electronic device being unsure on predicting the CRC failure and the CRC success.

12. The electronic device as claimed in claim 1, wherein the NN model is one of an Artificial Intelligence (AI) model, a Machine Learning (ML) model and a hybrid model.

13. The electronic device as claimed in claim 1, wherein the electronic device is at least one of a user equipment, a base station, a Virtualized Radio Access Network (VRAN), a Centralized Radio Access Network (CRAN), an Open Radio Access Network (O-RAN), a network service function, a virtualized network function, a smart phone, a tablet computer, a Personal Digital Assistance (PDA), a desktop computer, a cloud server, and an Internet of Things (IoT).

14. A method for predicting iterations for decoding encoded data in an electronic device, comprising:
receiving by the electronic device, the encoded data;
detecting, by the electronic device, at least one signal parameter associated with the encoded data; and predicting, by the electronic device, one of a Cyclic Redundancy Check (CRC) failure, a CRC success, and a CRC uncertainty in iterations for decoding the encoding data based on the at least one signal parameter using a Neural Network (NN) model.

15. The method as claimed in claim 14, wherein the method further comprises:
performing, by the electronic device, one of:
terminating decoding of the encoded data in response to predicting the CRC failure in the iterations,
determining a number of iterations required for obtaining the CRC success in the iterations based on the at least one signal parameter using the NN model in response to predicting the CRC success in the iterations, and
performing a next iteration in decoding of the encoded data in response to predicting the CRC uncertainty in the iterations.

16. The method as claimed in claim 15, wherein determining the number of iterations required for obtaining the CRC success further comprises:
determining a time required for the CRC success based on the number of iterations;
terminating decoding of the encoded data, in response to detecting that the time required for the CRC success by the number of iterations is greater than a threshold time; and
decoding the encoded data by the number of iterations, in response to detecting that the time required for the CRC success by the number of iterations is lesser than the threshold time.

17. The method as claimed in claim 15, wherein the method further comprises:
converting, by the electronic device, the encoded data into a CRC added information data based on the number of iterations using a decoder;
determining, by the electronic device, whether a CRC check on the CRC added information data is successful; and
performing, by the electronic device, one of:
terminating decoding of the encoded data, and obtaining information data from the CRC added information data in response to determining that the CRC check on the CRC added information data is successful, and
performing a next iteration in decoding of the encoded data in response to determining that the CRC check on the CRC added information data is unsuccessful.

18. The method as claimed in claim 14, wherein the NN model is configured to be trained for the prediction by:
determining, by the electronic device, a maximum number of iterations in decoding of the encoded data;
estimating, by the electronic device, a first CRC status in a half of the maximum number of iterations based on the at least one signal parameter, wherein the first CRC status is one of the CRC success and the CRC failure;
determining, by the electronic device, a second CRC status in the maximum number of iterations based on the at least one signal parameter, wherein the second CRC status is one of the CRC success and the CRC failure; and
training, by the electronic device, the NN model for the prediction based a match between the first CRC status and the second CRC status.

19. The method as claimed in claim 14, wherein the NN model comprises: an input layer, an output layer with a classifier for three classes of CRC prediction, and three hidden layers with leaky rectified linear unit (ReLU) activation functions and a plurality of neural blocks in each layer.

20. The method as claimed in claim 14, wherein the prediction includes the CRC uncertainty based on the electronic device being unsure on predicting the CRC failure and the CRC success.

* * * * *